United States Patent
Kwon et al.

(10) Patent No.: US 9,805,928 B2
(45) Date of Patent: Oct. 31, 2017

(54) LOW TEMPERATURE NANOWIRE GROWTH ON ARBITRARY SUBSTRATES

(71) Applicants: Jae Wan Kwon, Columbia, MO (US); Baek Hyun Kim, Columbia, MO (US)

(72) Inventors: Jae Wan Kwon, Columbia, MO (US); Baek Hyun Kim, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 15/059,368

(22) Filed: Mar. 3, 2016

(65) Prior Publication Data

US 2016/0268131 A1 Sep. 15, 2016

Related U.S. Application Data

(60) Provisional application No. 62/132,243, filed on Mar. 12, 2015.

(51) Int. Cl.
*H01L 21/02* (2006.01)
*B82Y 40/00* (2011.01)
*B82B 3/00* (2006.01)

(52) U.S. Cl.
CPC ...... *H01L 21/02645* (2013.01); *B82B 3/0038* (2013.01); *B82Y 40/00* (2013.01); *H01L 21/02554* (2013.01); *H01L 21/02603* (2013.01)

(58) Field of Classification Search
CPC ......... H01L 21/02554; H01L 21/02603; H01L 21/02645; B82Y 40/00; B82B 3/0038
See application file for complete search history.

(56) References Cited

U.S. PATENT DOCUMENTS

| | | | | |
|---|---|---|---|---|
| 6,248,674 B1* | 6/2001 | Kamins | ..................... | B82B 3/00 257/734 |
| 8,658,462 B2* | 2/2014 | Jung | ..................... | B82Y 30/00 438/104 |
| 8,679,949 B2* | 3/2014 | Park | ..................... | B82Y 10/00 257/9 |
| 8,691,012 B2* | 4/2014 | Cha | ..................... | C30B 25/00 117/84 |
| 8,698,122 B2* | 4/2014 | Park | ..................... | B82Y 10/00 257/9 |
| 8,778,731 B2* | 7/2014 | Kim | ..................... | H01L 29/227 257/E21.464 |
| 8,901,247 B2* | 12/2014 | Lu | ..................... | B82Y 30/00 525/418 |
| 9,193,580 B1* | 11/2015 | Sodano | ............... | G01P 15/0922 |
| 9,410,949 B2* | 8/2016 | Singamaneni | ........... | B82Y 5/00 |
| 2014/0011013 A1* | 1/2014 | Jin | ..................... | B05D 5/08 428/297.4 |
| 2014/0291569 A1* | 10/2014 | Jeon | ..................... | C01G 9/02 252/62.9 R |

(Continued)

*Primary Examiner* — Savitr Mulpuri
(74) *Attorney, Agent, or Firm* — Polster Lieder

(57) ABSTRACT

The present invention provides a method to manufacture nanowires. In various embodiments, a method is provided for producing an oxidized metal layer as a heterogeneous seed layer on arbitrary substrate for controlled nanowire growth is disclosed which comprises depositing a metal layer on a substrate, oxidizing the metal layer in air ambient or in oxidizing agent, and growing nanowires at low temperatures on oxidized metal layers on virtually any substrate.

9 Claims, 24 Drawing Sheets

(56) References Cited

U.S. PATENT DOCUMENTS

2015/0311363 A1* 10/2015 Park ............... C08G 61/126
                                                    136/263
2016/0115081 A1*  4/2016 Cho ................ C02F 1/325
                                                    442/123

* cited by examiner

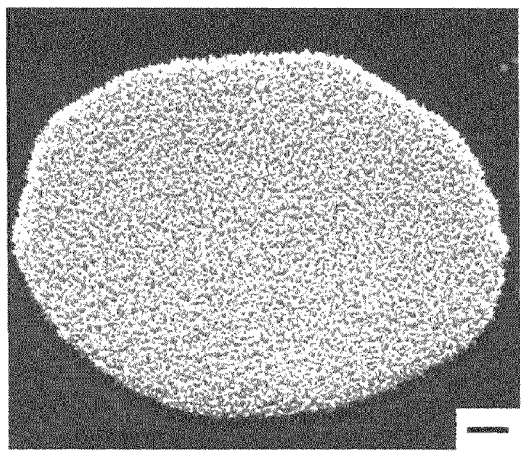 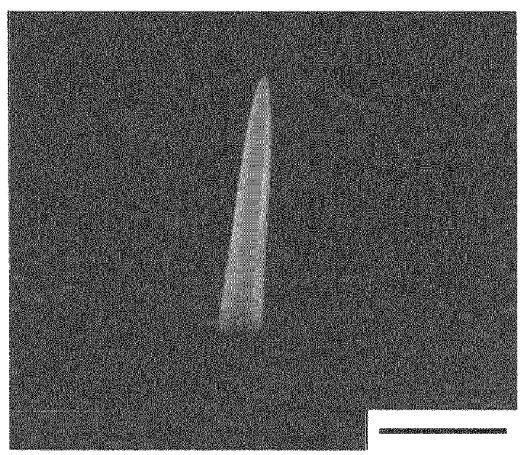
FIG. 3c                    FIG. 3d

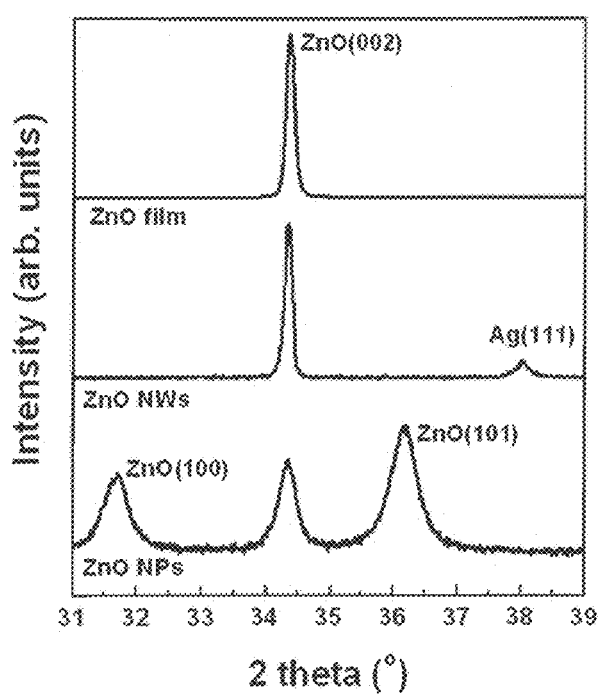
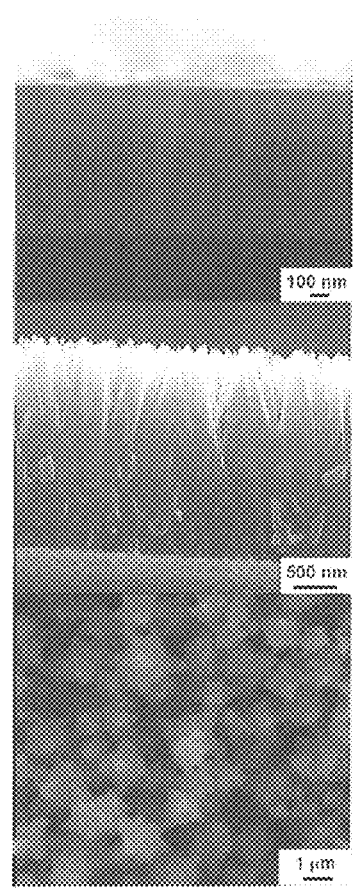
FIG. 4a                    FIG. 4b

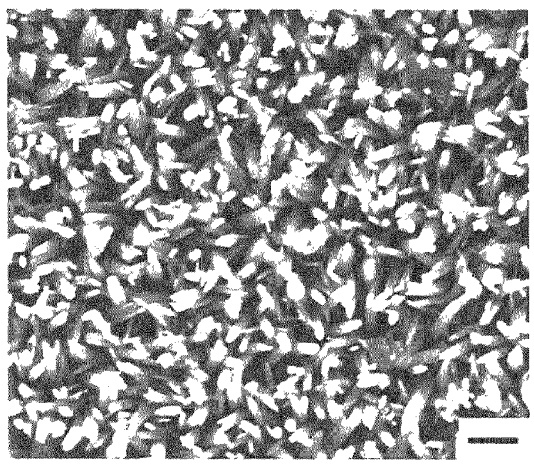 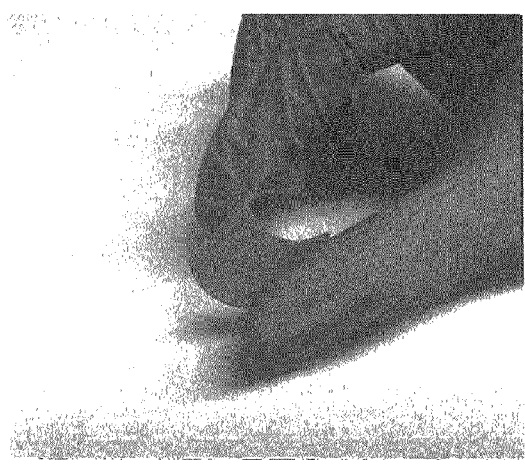
FIG. 10a                    FIG. 10b

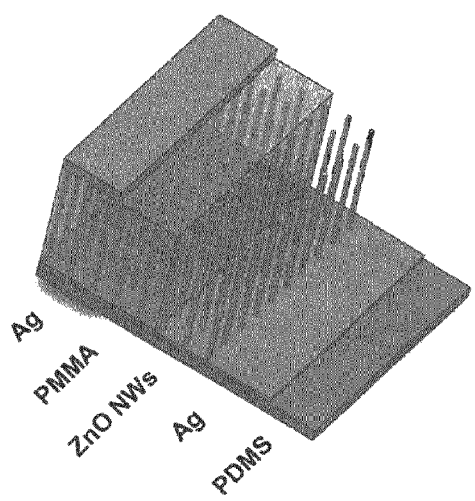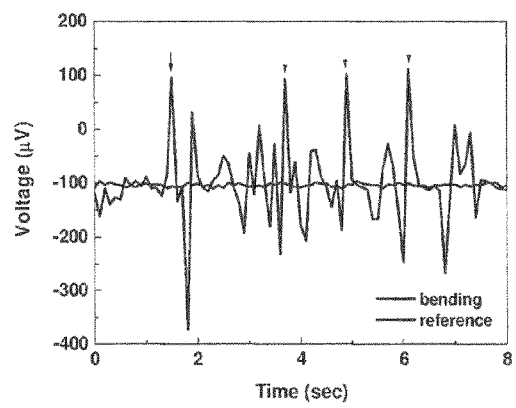
FIG. 10c
FIG. 10d

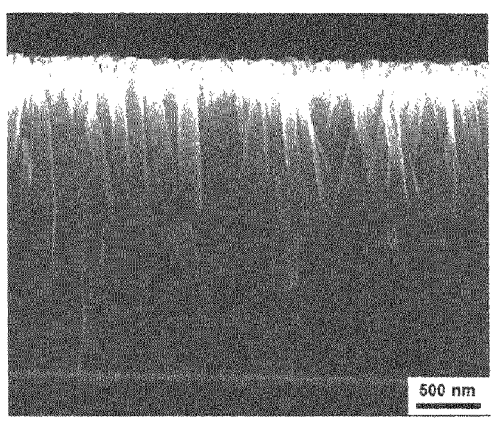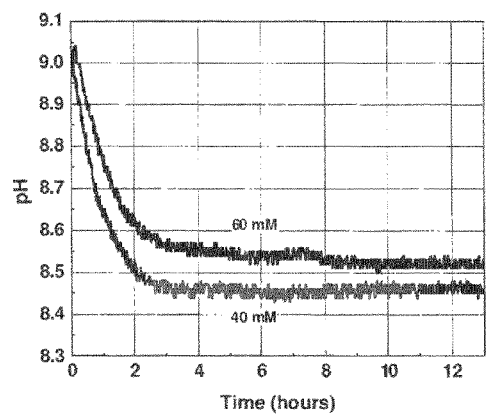
FIG. 12b
FIG. 13a

LOW TEMPERATURE NANOWIRE GROWTH ON ARBITRARY SUBSTRATES

CROSS-REFERENCE TO RELATED APPLICATIONS

This application claims the benefit of U.S. Provisional Application No. 62/132,243, filed on Mar. 12, 2015.

FIELD

The present teachings relate to the growth of zinc oxide nanowires, and more particularly to the growth on zinc oxide nanowires on generally any surface using a low temperature hydrothermal growth method.

BACKGROUND

The statements in this section merely provide background information related to the present disclosure and may not constitute prior art.

Recently, zinc oxide (ZnO) nanowires have been widely studied because of their superior electrical, mechanical, and optical properties. Various methods including vapor-liquid-solid (VLS) growth, chemical vapor deposition (CVD), electrochemical deposition (ED), and hydrothermal approaches have been employed for the synthesis of ZnO nanowires. However, the VLS, CVD, and ED methods require complicated and expensive equipment and can only be used under limited conditions, such as with single-crystalline substrates and at relatively high temperatures, e.g., 300° C. and above. Thus, hydrothermal synthesis is a more convenient and cost-effective approach for the large-scale preparation of well-ordered ZnO nanowire arrays at low temperatures. Recently, numerous hydrothermal growth methods of ZnO nanowires on various substrates have been vigorously explored and are continuously being evolved. Despite the benefits of hydrothermal synthesis of ZnO nanowires, the necessity of a crystalline ZnO seed layer limits the flexibility of this method due to the requirements of additional vacuum technology and high temperature processes.

SUMMARY

Over the past decade, one-dimensional (1D) materials have been studied intensively in various fields of nanotechnology. A bottom-up synthetic approach, such as that presently disclosed, can offer multiple novel design-by-choice schemes to facilitate the compact assembly of multifunctional components on a substrate. Complex components can be constructed with desired properties, including electronic, photonic, biological, energetic, piezoelectric, and magnetic properties, with novel functionalities such as quantum confinement effects and high surface-to-volume ratios.

This synthetic approach enables controlled growth on any substrate, thereby enabling a broad expansion of the applications of ZnO materials without restrictions imposed by the shape of the substrate materials. The present disclosure describes and demonstrates methods whereby metal catalysts play an important role in ZnO nanowire synthesis in different growth directions due to the altered lattice constant of the catalyst layer. The electronegativity of the metal catalyst layer is found to influence the controlled production of direction-dependent ZnO nanowires on virtually any substrate in any shape.

For example, the present disclosure provides methods for controlled ZnO nanowire growth on various organic and inorganic materials without the requirement of a homogeneous seed layer and a high temperature process. The present disclosure additionally illustrates the important role of electronegativity in the nanowire growth on arbitrary substrates. Particularly, using heterogeneous metal oxide interlayers with low-temperature hydrothermal methods, the present disclosure provides methods for the well-controlled growth, or synthesis, of ZnO nanowire arrays and single nanowires on flat and/or curved surfaces. The metal catalyst and heterogeneous metal oxide interlayers provide a lattice-match with ZnO and largely influence the controlled alignment.

Further areas of applicability of the present teachings will become apparent from the description provided herein. It should be understood that the description and specific examples are intended for purposes of illustration only and are not intended to limit the scope of the present teachings.

DRAWINGS

The drawings described herein are for illustration purposes only and are not intended to limit the scope of the present teachings in any way.

FIGS. 3a through 3f are scanning electron microscopy (SEM) images of ZnO nanowires grown on oxidized silver films deposited over the various substrates, in accordance with various embodiments of the present disclosure.

FIG. 4a shows XRD patterns of a pure ZnO film deposited on a silicon substrate using an RF sputtering system (black line), ZnO nanowires grown on an oxidized silver film on a polyimide substrate (red line), and ZnO nanoparticles grown in the nutrition solution (blue line), in accordance with various embodiments of the present disclosure.

FIG. 4b illustrates SEM images of the structural properties of ZnO film, nanowires, and nanoparticles, in accordance with various embodiments of the present disclosure.

Figure 6A:
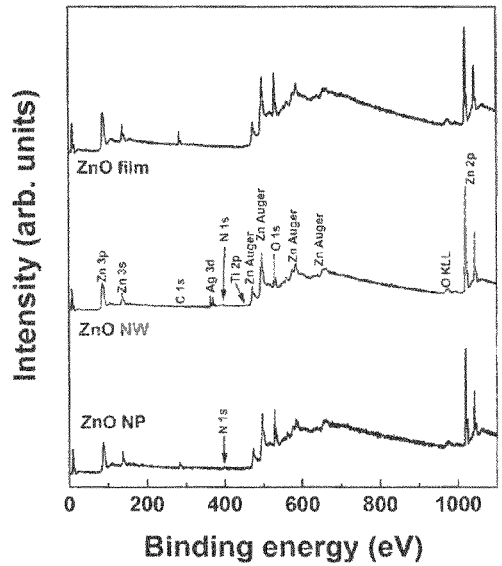

FIG. 6a provides an XPS spectra of a pure ZnO film, the ZnO nanowires, and the ZnO nanoparticles, which indicate the presence of Zn, O, Ag, Ti, N, and C, in accordance with various embodiments of the present disclosure.

Figure 6B:
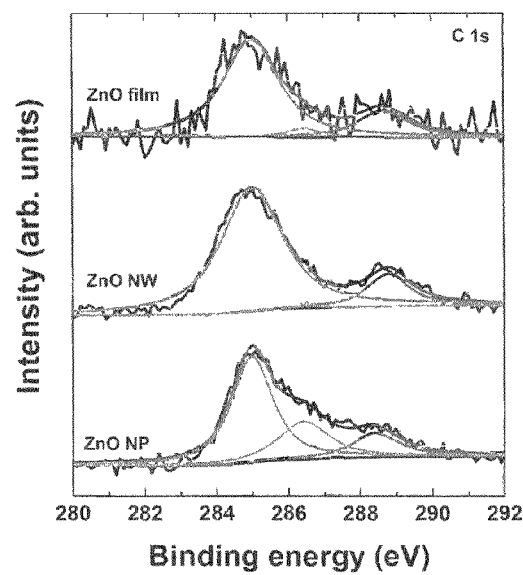

FIG. 6b illustrates a binding energy (BE) scale calibrated using a carbon peak (C-1s) at 285 eV as a reference, in accordance with various embodiments of the present disclosure.

Figure 6C:
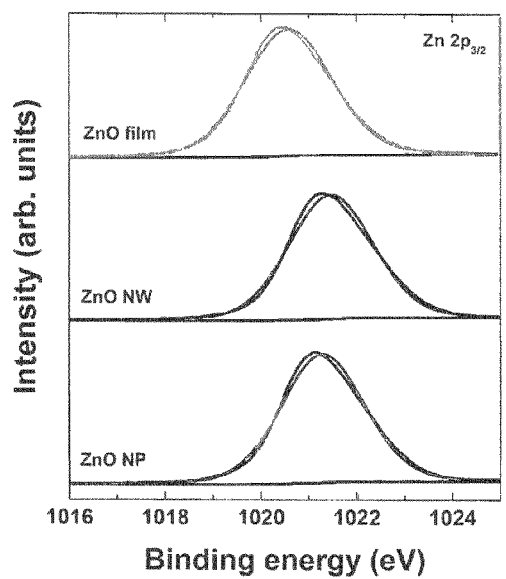

FIG. 6c illustrates a pure ZnO film exhibiting a Zn-2p$_{3/2}$ core level with a peak position of 1020.58 eV, in accordance with various embodiments of the present disclosure.

Figure 6D:
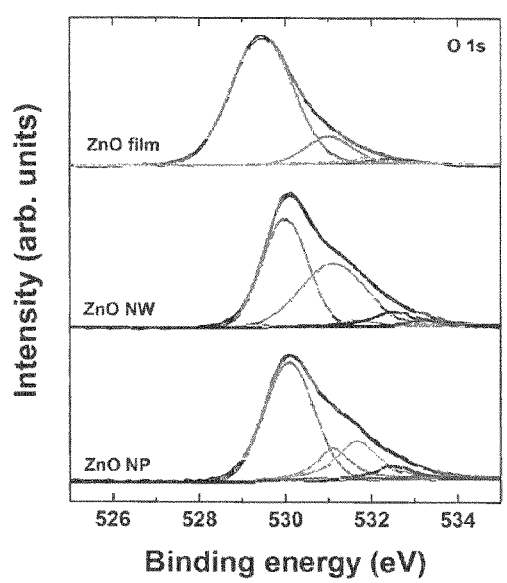

FIG. 6d is an illustration of asymmetric peaks observed in the O-1s region deconvoluted by several subspectral components, in accordance with various embodiments of the present disclosure.

Figure 6E:
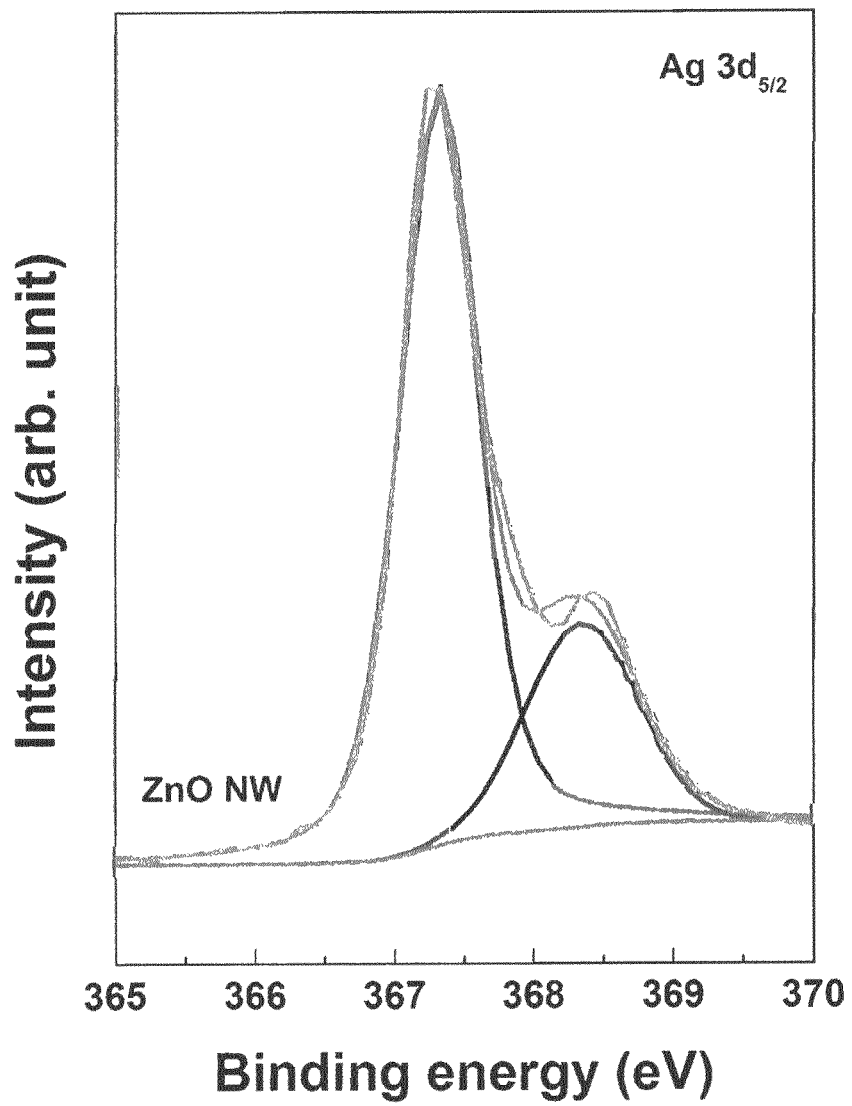

FIG. 6e illustrates an Ag-3d BE region of the asymmetric peaks shown in FIG. 6d, in accordance with various embodiments of the present disclosure.

Figure 7A:
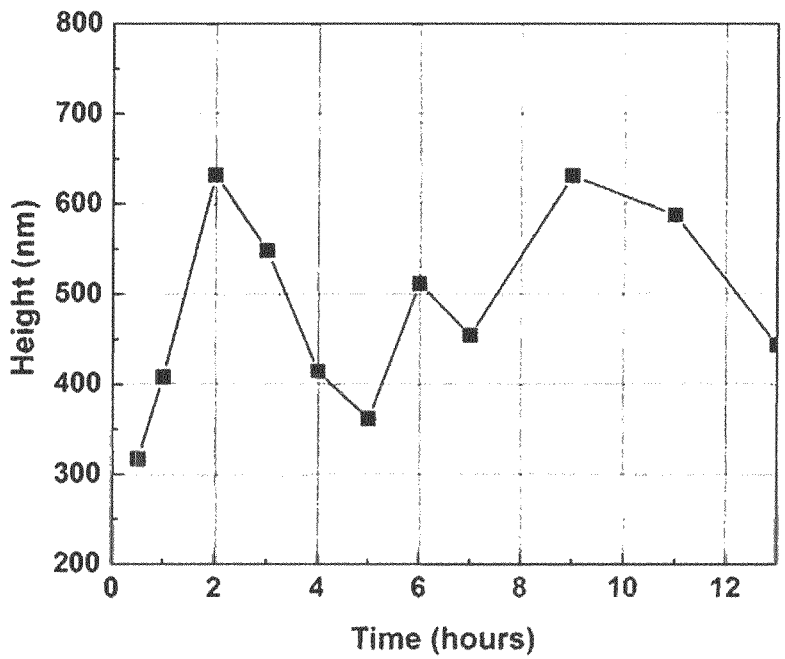

FIG. 7a illustrates the dependence of the average nanowire height on growth time, in accordance with various embodiments of the present disclosure.

Figure 7B:
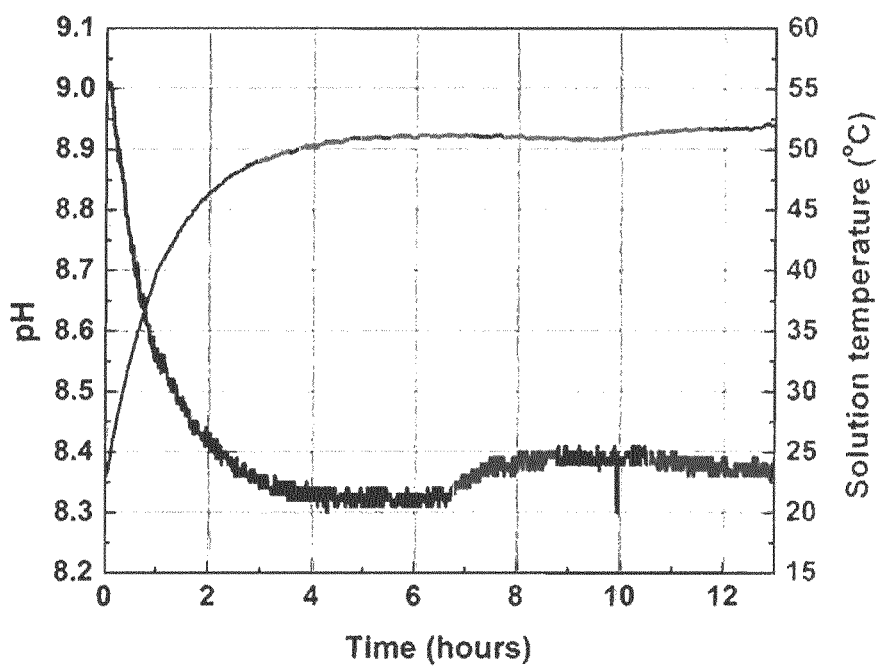

FIG. 7b illustrates the difference between a set temperature and a solution temperature resulting from poor thermal conductivity of glass and an aqueous solution when determining the dependence of the average nanowire height on growth time shown in FIG. 7a, in accordance with various embodiments of the present disclosure.

Figure 8A:
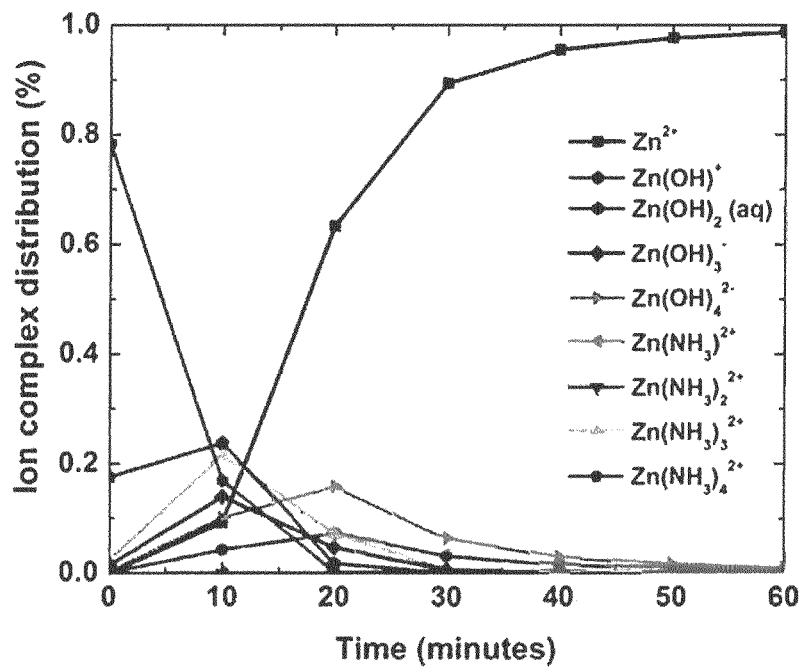
Figure 8B:
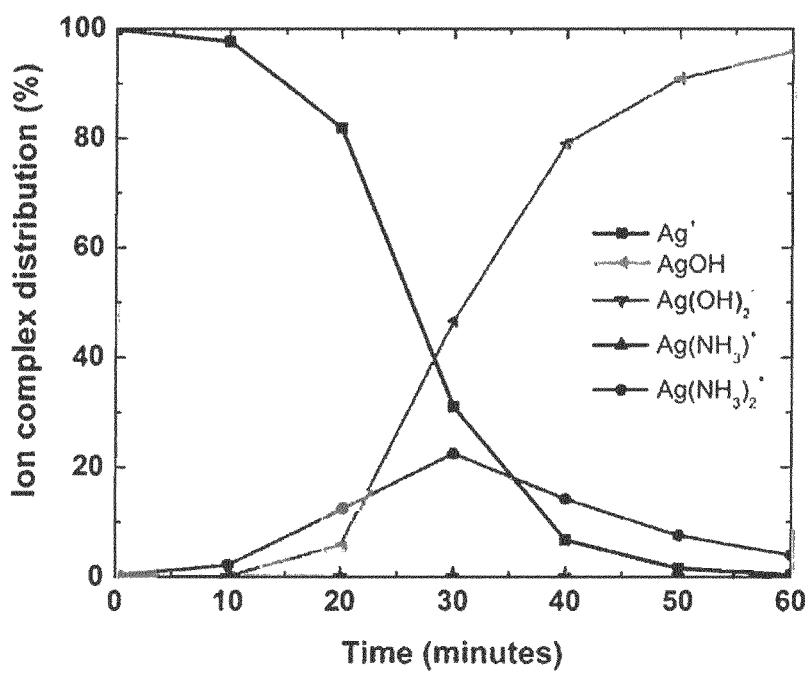

FIGS. 8a and 8b illustrate an ion complex distribution of $Zn^{2+}$ and $Ag^+$ ions using time, solution temperature, and pH values determined from calculated speciation diagrams, in accordance with various embodiments of the present disclosure.

Figure 9A:
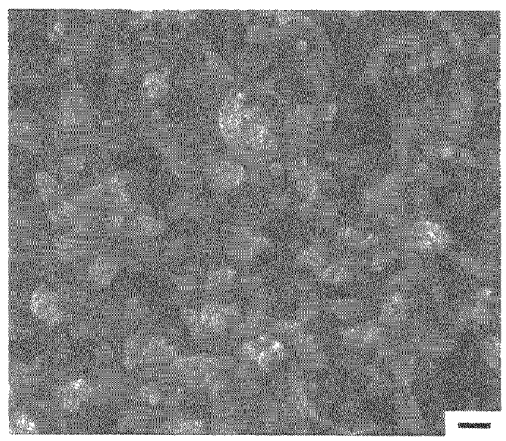

FIG. 9a is a SEM image of ZnO nanowires on a titanium substrate without an Ag catalyst treatment, in accordance with various embodiments of the present disclosure.

Figure 9B:
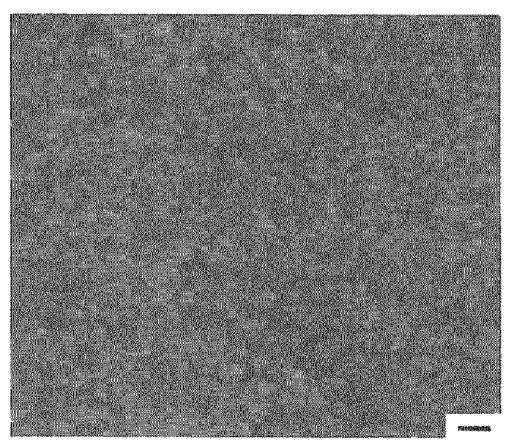

FIG. 9b is the SEM image of ZnO nanowires on a titanium substrate with an Ag catalyst treatment, in accordance with various embodiments of the present disclosure.

Figure 9C:
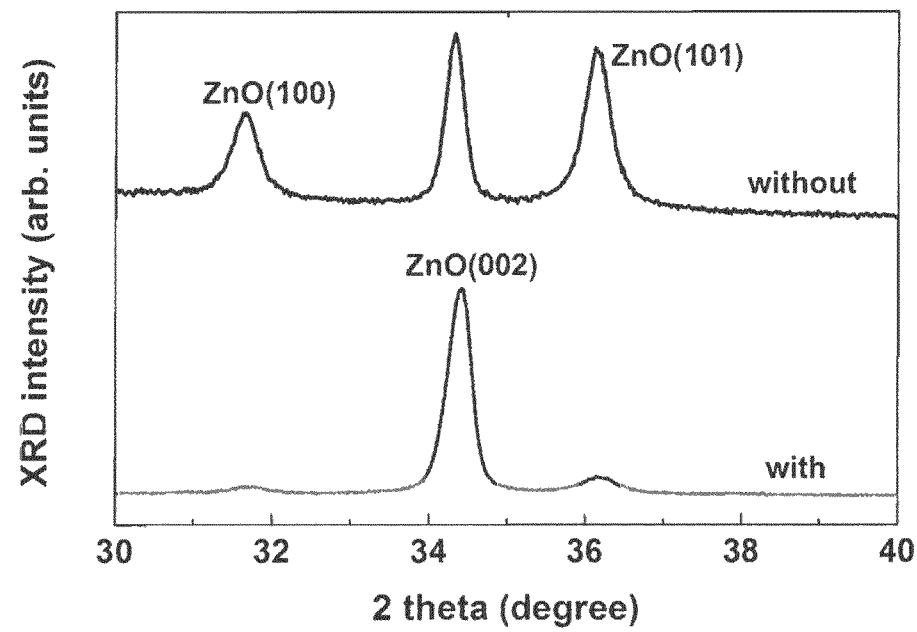

FIG. 9c illustrates XRD data of ZnO nanowires on a titanium substrate with (black line) and without (red line) Ag catalyst treatment, in accordance with various embodiments.

Figure 9F:
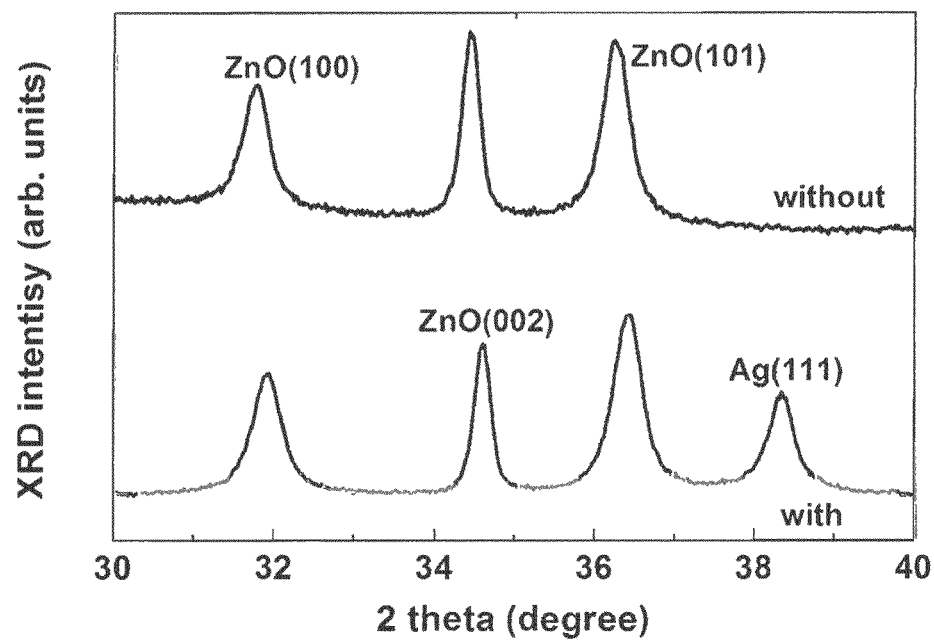
Figure 9D:
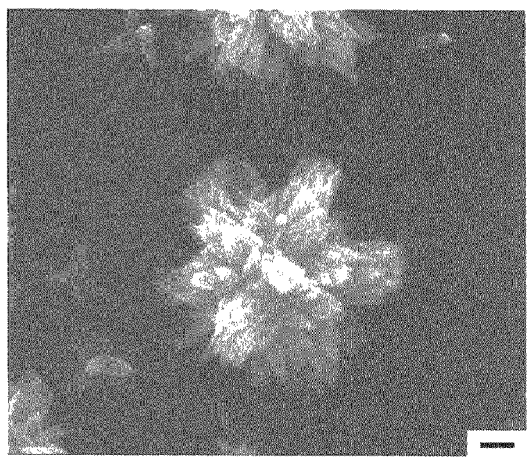

FIG. 9d illustrates SEM images of ZnO nanowires on molybdenum substrates without either plasma or Ag-catalyst treatments, in accordance with various embodiments of the present disclosure.

Figure 9E:
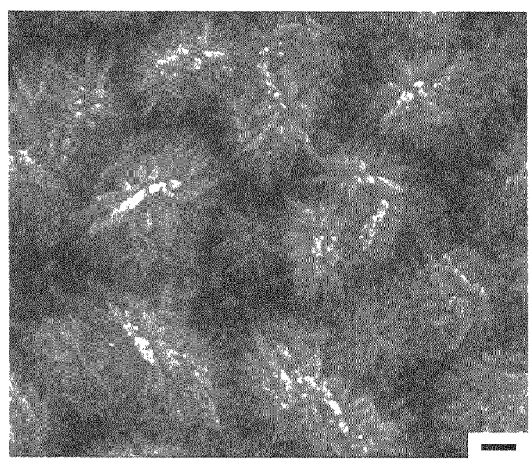

FIG. 9e illustrates SEM images of ZnO nanowires on molybdenum substrates with both plasma and Ag-catalyst treatments, in accordance with various embodiments of the present disclosure.

FIG. 9f illustrates XRD data of ZnO nanowires on a molybdenum substrate with (black line) and without (red line) Ag-catalyst treatment, in accordance with various embodiments of the present disclosure.

FIG. 10a shows an SEM image of ZnO nanowires grown on oxidized silver nanoparticles on a flexible PDMS substrate, in accordance with various embodiments of the present disclosure.

FIG. 10b illustrated the flexibility of the PDMS substrate shown in FIG. 10a, in accordance with various embodiments of the present disclosure.

FIG. 10c illustrates a PMMA spin-coated to insulate two electrodes on both sides of ZnO nanowires, in accordance with various embodiments of the present disclosure.

FIG. 10d demonstrates an increase in output voltage is correlated with the bending, in accordance with various embodiments of the present disclosure.

Figure 11:
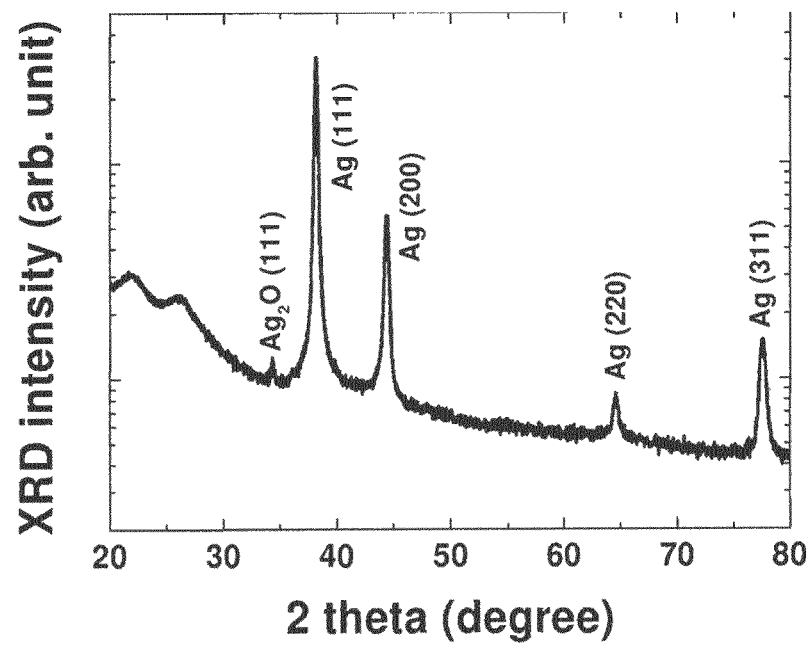

FIG. 11 illustrates XRD data of a naturally oxidized silver film on a polyimide substrate, in accordance with various embodiments of the present disclosure.

Figure 12A:
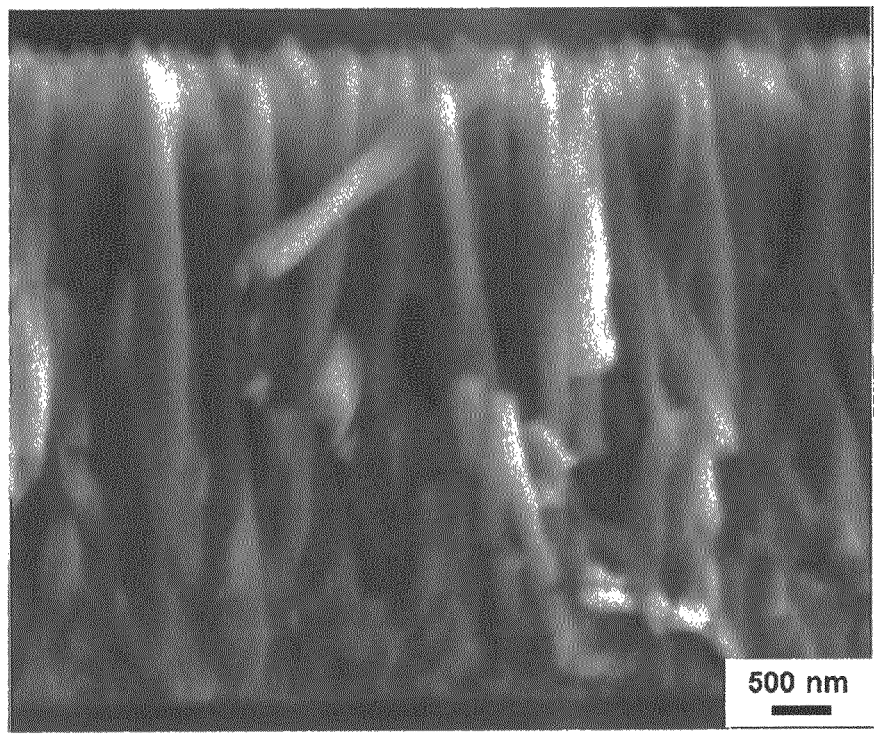

FIGS. 12a and 12b, illustration a comparison of ZnO nanowires grown on different seed layers, in accordance with various embodiments of the present disclosure.

FIG. 13a illustrates a growth condition of ZnO nanowires in situ pH and solution temperature as functions of reaction time and molar concentration at a set temperature of 90° C., in accordance with various embodiments of the present disclosure.

Figure 13B:
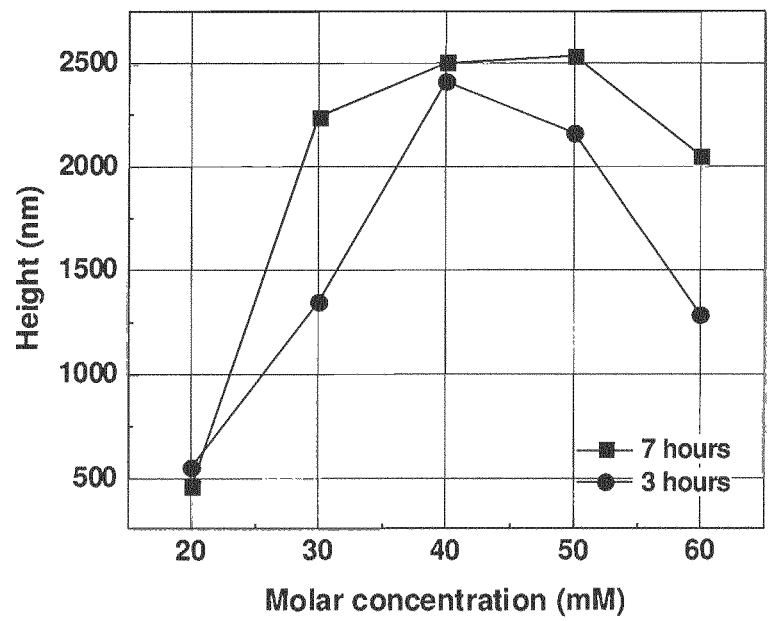

FIG. 13b illustrates a growth condition of ZnO nanowires average heights of ZnO nanowires as a function of molar concentration at a set temperature of 90° C., in accordance with various embodiments of the present disclosure.

Figure 13C:
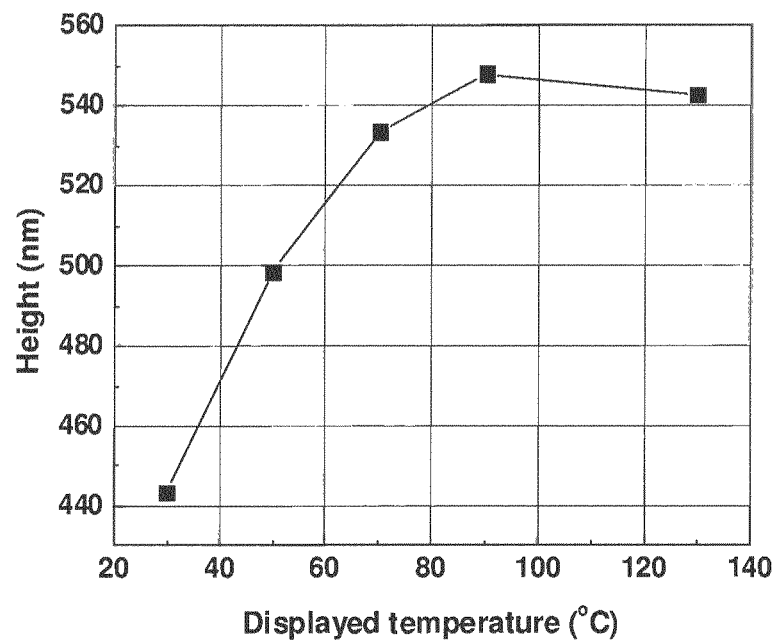

FIG. 13c illustrates a growth condition of ZnO nanowires average heights of ZnO nanowires as a function of displayed temperature, in accordance with various embodiments of the present disclosure.

Figure 14:
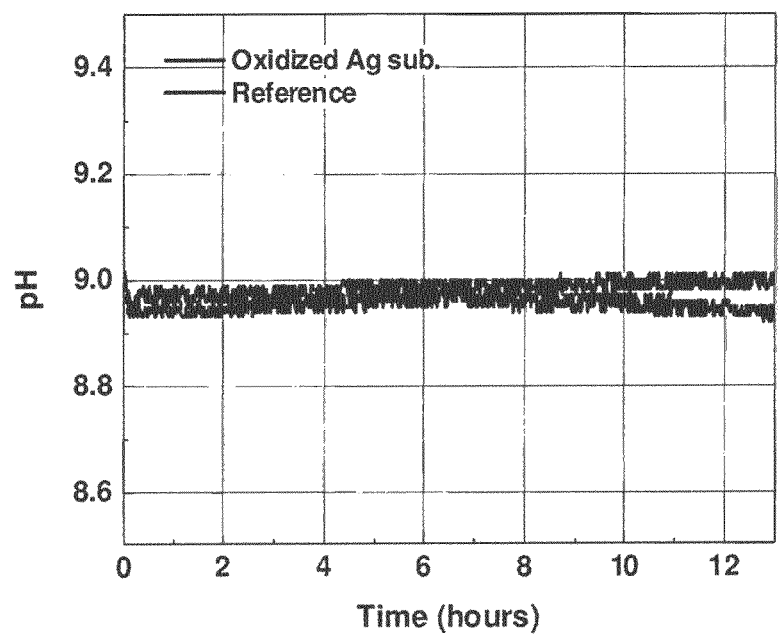

FIG. 14 illustrates pH values of a solution with oxidized silver films on polyimide and a reference solution at room temperature, in accordance with various embodiments of the present disclosure.

Figure 15A:
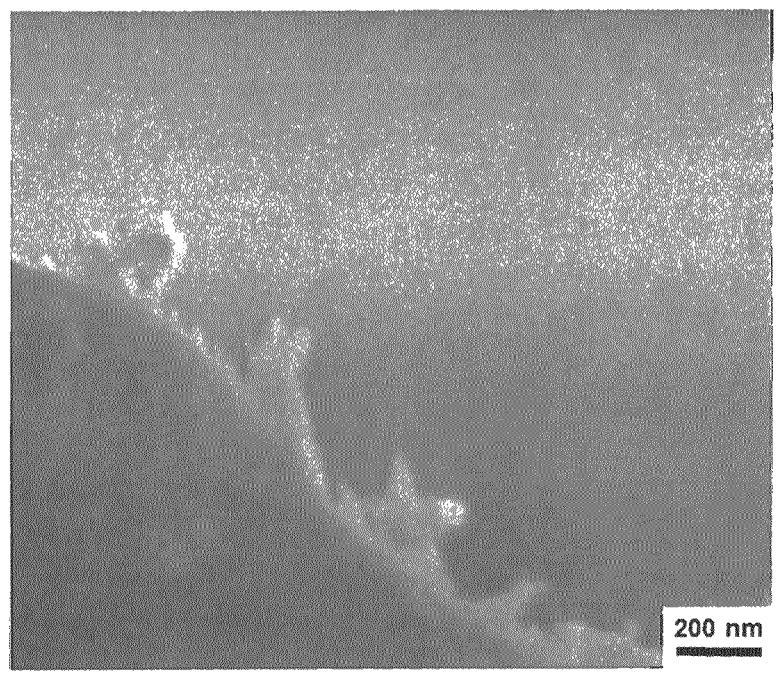

FIG. 15a illustrates an SEM image of ZnO nanostructures after 10 min in a 20 mM solution, in accordance with various embodiments of the present disclosure.

Figure 15B:
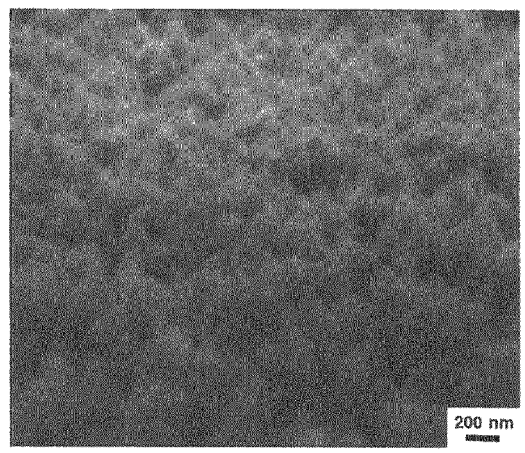

FIG. 15b illustrates an SEM image of ZnO nanostructures partially covering a silver surface, in accordance with various embodiments of the present disclosure.

Figure 15C:
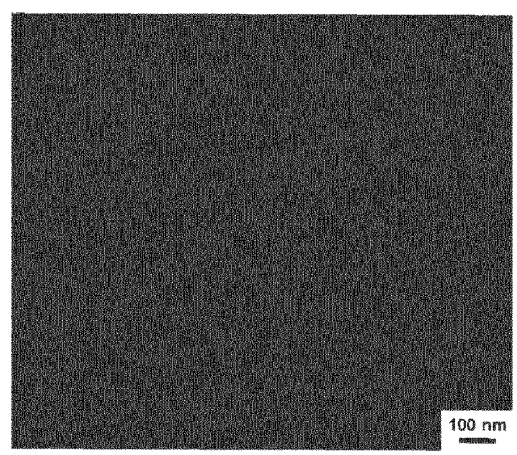

FIG. 15c illustrates an SEM image of ZnO nanowires fully grown on the silver substrate, in accordance with various embodiments of the present disclosure.

Figure 16A:
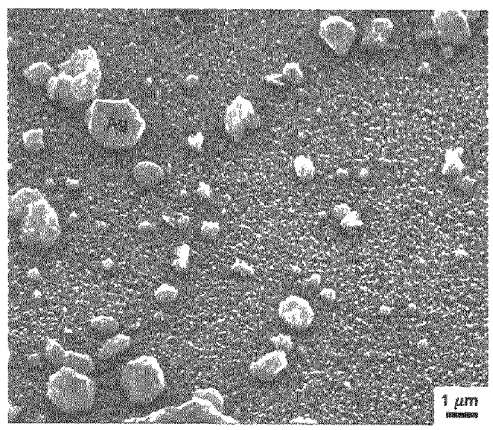

FIG. 16a illustrates a low magnification SEM image of ZnO nanowires on copper substrates deposited on polyimide using RF sputtering, in accordance with various embodiments of the present disclosure.

Figure 16B:
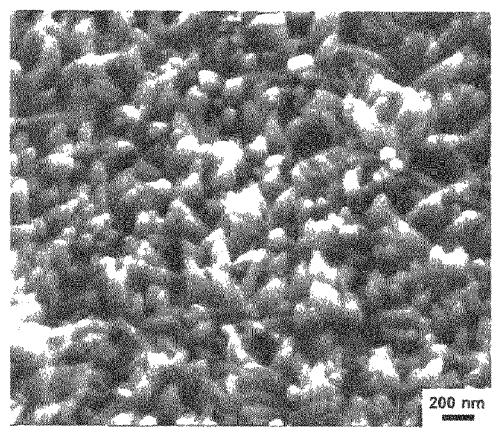

FIG. 16b illustrates a high magnification SEM image of ZnO nanowires on copper substrates deposited on polyimide using RF sputtering, in accordance with various embodiments of the present disclosure.

Corresponding reference numerals indicate corresponding parts throughout the several views of drawings.

DETAILED DESCRIPTION

The following description is merely exemplary in nature and is in no way intended to limit the present teachings, application, or uses. Throughout this specification, like reference numerals will be used to refer to like elements.

The present disclosure provides a low temperature (e.g., less than 300° C.) hydrothermal method 100 for synthesizing, or growing, zinc oxide (ZnO) nanowire on generally any substrate (e.g., flexible, rigid, low melting point, high melting point, plastic, metal, and so on substrates) in a non-vacuum controlled environment.

Figure 1:
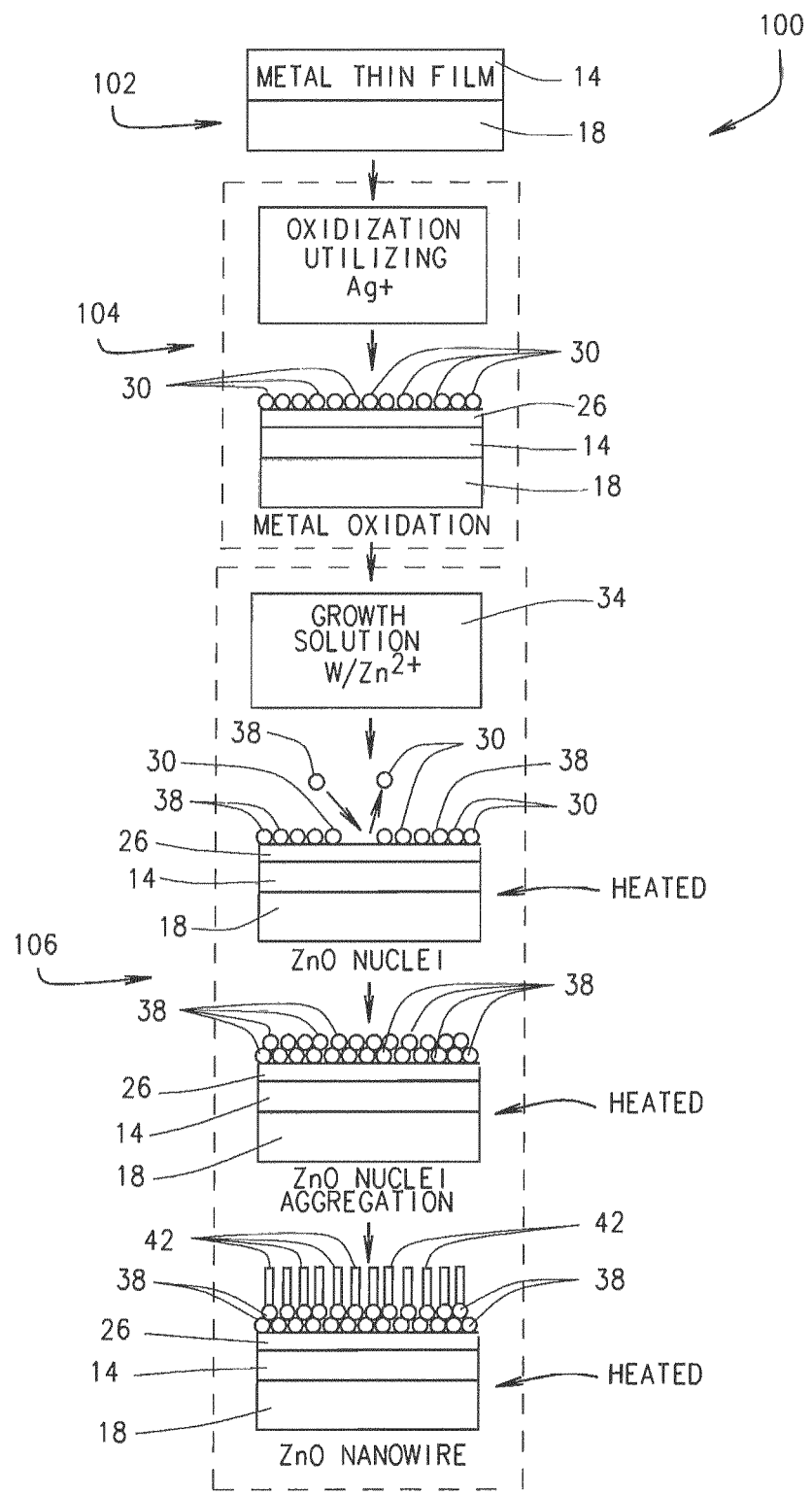
FIG. 1 is a flow diagram illustrating a low temperature nanowire hydrothermal growth method for synthesizing zinc oxide nanowires on any arbitrary substrate, in accordance with various embodiments of the present disclosure.

Referring to FIG. 1, in various embodiments, the method 100 generally comprises applying a thin metal film 14 to a substrate 18, as illustrated in step 102. Importantly, the substrate 18 can comprise generally any metal, plastic, rubber, synthetic or composite material having generally any melting point and having generally any flexibility, tensility, docility, rigidity, plasticity or density. The thin metal film 14 can be any desired metal (e.g., silver (Ag), nickel (Ni), iron (Fe), aluminum (Al), titanium (Ti), molybdenum (Mo), tungsten (W), or copper (Cu) applied to a thickness of between 10-300 nm thick, and can be applied to the substrate 18 using any known deposition method such as radio frequency (RF) sputtering, chemical vapour deposition (CVD), electroless plating or electrochemical deposition (ED).

As illustrated at step 104, after the thin metal film 14 has been deposited and adhered to the substrate 18, oxidization of the thin metal film 14 is produced utilizing silver (Ag) ions that act as an oxidization catalyst to provide a very thin, very uniform oxidization layer 26 across the entire top surface of the thin metal film 14. The top surface of the uniform oxidization layer 26 comprises a monolayer of hydroxide ions 30 (OH) uniformly distributed across the entire the top surface of the uniform oxidization layer 26.

Subsequently, as illustrated at step 106, the cumulative structure comprising the substrate 18, the thin metal film 14, the uniform oxidization layer 26 with the monolayer of hydroxide ions 30 (OH), is submersed in a growth solution 34 comprising zinc ions 38 ($Zn^{+2}$ ions) and heated to a temperature between 5° C. and 150° C. Consequently, the $Zn^{+2}$ ions 38 in the growth solution will replace the OH ions 30 to form a uniform layer of evenly distributed zinc ($Zn^{+2}$) ions 38 (also referred to as zinc oxide (ZnO) nuclei 38), on top surface of the uniform oxidization layer 26. Thereafter, the ZnO nuclei 38 aggregate to form one or more subsequent uniform layers of evenly distributed ZnO nuclei 38, and due to the very uniform layers of evenly distributed ZnO nuclei 38, nanowires 42 will grow in an uniform, evenly distributed vertical orientation.

Because the hydroxide ions 30 (OH) produced utilizing ionized Ag strongly attract negatively charged Zn ion complexes by Coulombic forces to ZnO nuclei 38 on the thin oxidized layer 26, the oxidized layer 26 provides a good lattice-matched structure with ZnO nuclei 38.

Basically, the ZnO nucleation occurs at stable sites with lowest surface energy. The sites with large lattice mismatch between ZnO and oxidized layer 26 are forced to separate ZnO nucleus due to their high surface energy. In various implementations, to reduce surface energy and lattice mismatch, water molecules can oxidize the ionized oxidized layer 26 using environmental thermal energy given by $M^+ + OH^- \rightarrow M(OH) \rightarrow MO^- + H^+$, where M is metal. Usually, ionized metal atoms result from oxidized metal atoms, which have been exposed and oxidized in ambient air.

The low temperature hydrothermal ZnO nanowire growth method 100, as described herein, can be used with flexible plastic substrates 18 without using any of conventional thermally damaging processes for many applications such as flexible solar cells and tactile sensor on artificial skin.

Figure 2A:
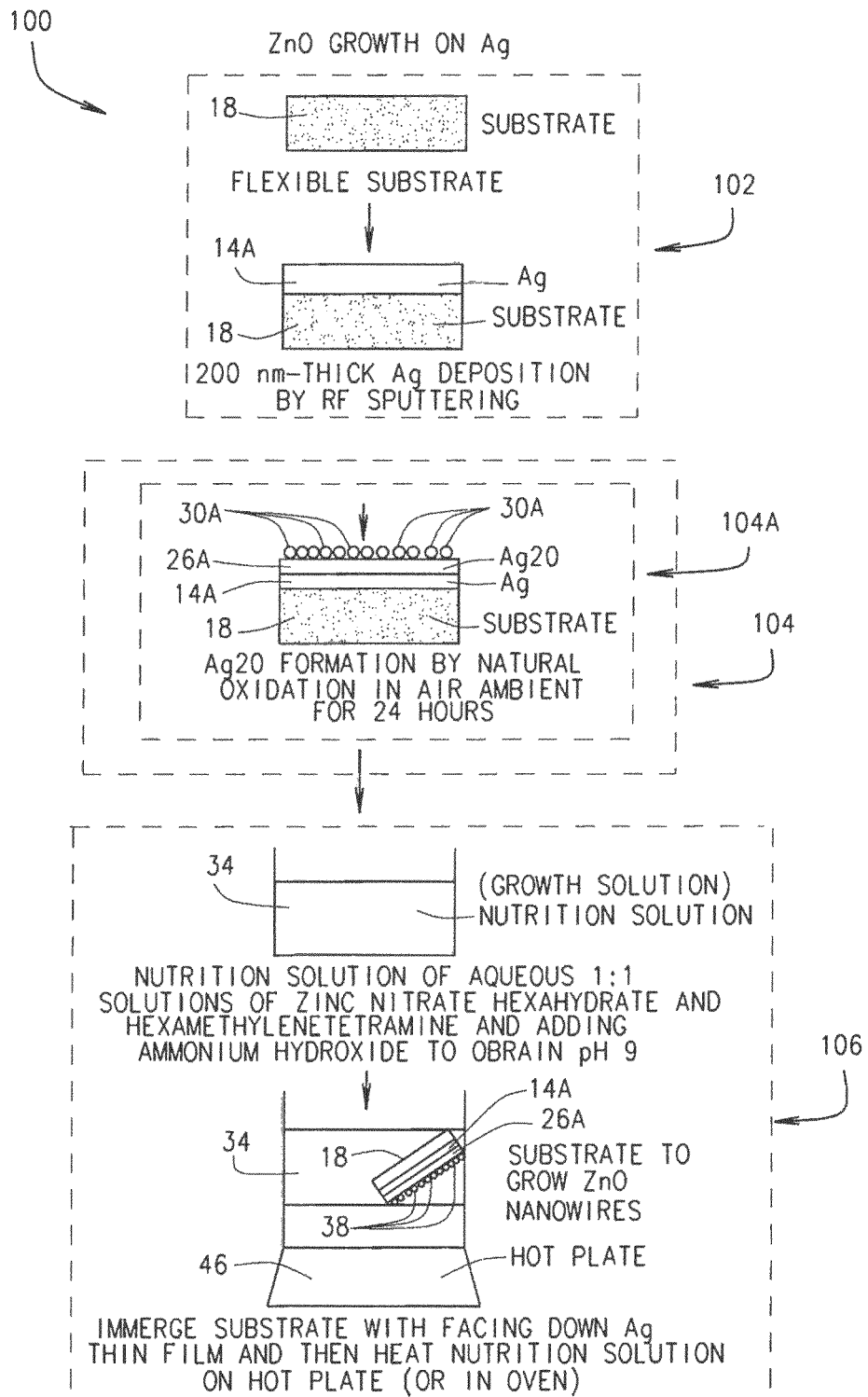
FIG. 2A is a flow diagram illustrating the low temperature nanowire hydrothermal growth method for synthesizing zinc oxide nanowires on any arbitrary substrate shown in FIG. 1, wherein the zinc oxide nanowires are grown on a thin silver (Ag) film applied to the substrate, in accordance with various embodiments of the present disclosure.

Referring now to FIG. 2A, in various embodiments, the step 102 of applying a thin metal film 14 to the substrate 18 comprises applying a thin silver (Ag) film (i.e., thin metal Ag film 14A) to the substrate 18 using RF sputtering (other suitable deposition method). Whereafter the step 104 of oxidizing the thin metal film 14 utilizing silver (Ag) ions comprises allowing the thin Ag film 14A to naturally oxidize in the ambient air for a desired amount of time (e.g., 5-36 hours) to provide the a very thin, very uniform silver oxide (Ag2O) layer 26A across the entire top surface of the thin metal film 14 having a monolayer of Ag2O ions 30A uniformly distributed across the entire top surface of the uniform Ag2O layer 26A.

Subsequently, the step 106 of submersing the cumulative structure in to the growth solution 34 comprises submersing the cumulative structure comprising the substrate 18, the thin Ag film 14A, the uniform Ag2O layer 26A with the monolayer of Ag2O ions 30A into a growth solution 34 of aqueous 1:1 solutions of zinc nitrate hexahydrate and hexamethylenetetramine and heating the growth solution 34 to a temperature between 5° C. and 150° C. The growth solution 34 can be heated using and desirable heating means such as a hot plate 46 or an oven. Consequently, the Zn+2 ions 38 in the growth solution replace the Ag2O ions 30A to form the uniform layer of evenly distributed zinc ZnO nuclei 38 on the top surface of the uniform Ag2O layer 26A. Thereafter, the ZnO nuclei 38 aggregate to form one or more subsequent uniform layers of evenly distributed ZnO nuclei 38, and due to the very uniform layers of evenly distributed ZnO nuclei 38, nanowires 42 will grow in an uniform, evenly distributed vertical orientation.

Figure 2B:
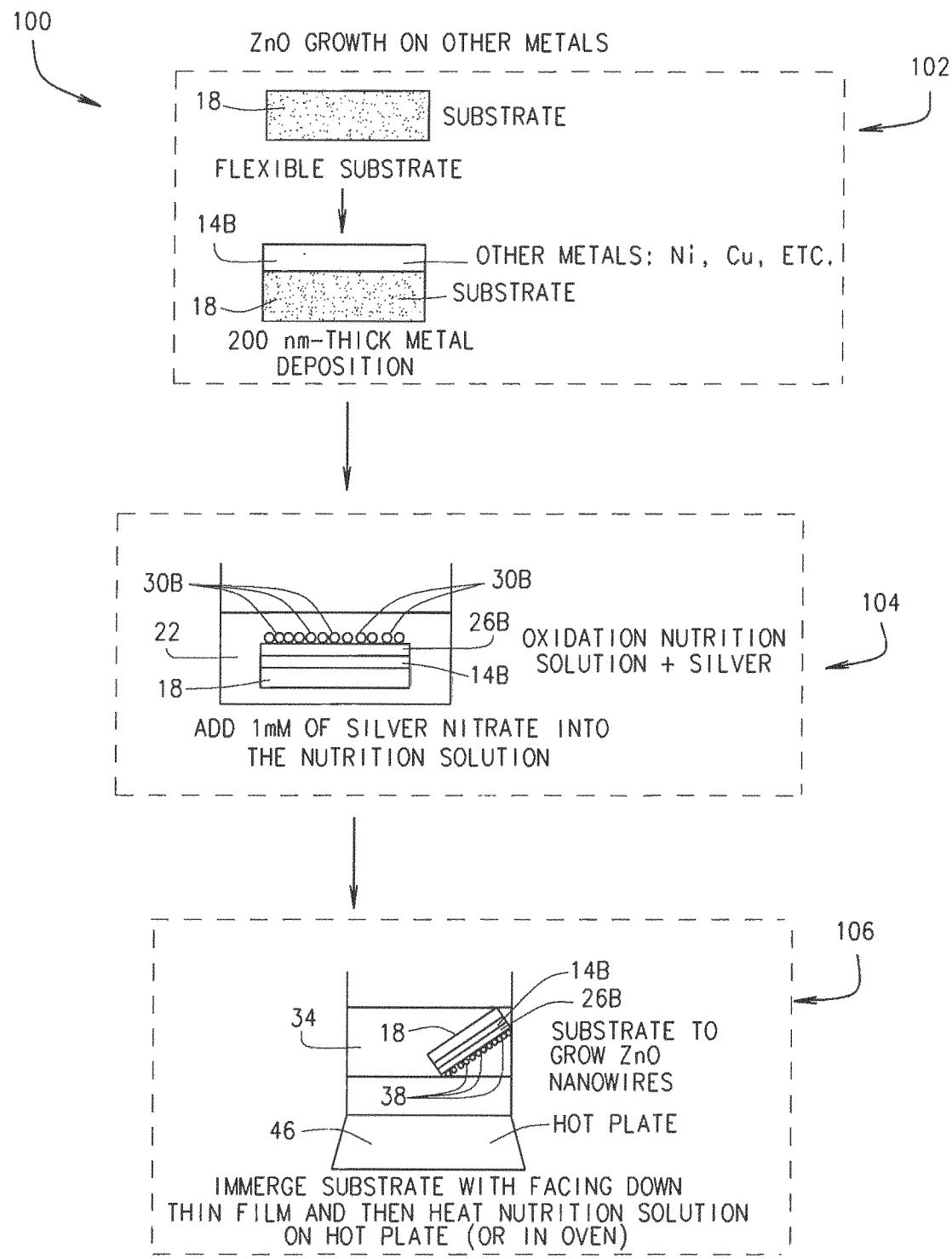
FIG. 2B is a flow diagram illustrating the low temperature nanowire hydrothermal growth method for synthesizing zinc oxide nanowires on any arbitrary substrate shown in FIG. 1, wherein the zinc oxide nanowires are grown on a thin metal film (other than Ag) applied to the substrate, in accordance with various other embodiments of the present disclosure.

Referring now to FIG. 2B, in various other embodiments, the step 102 of applying a thin metal film 14 to the substrate 18 comprises applying a thin metal film 14B comprising a metal other than silver (Ag) (e.g., nickel (Ni), iron (Fe), aluminum (Al), titanium (Ti), molybdenum (Mo), tungsten (W), or copper (Cu)) to the substrate 18 using any suitable deposition method. Whereafter the step 104 of oxidizing the thin metal film 14 utilizing silver (Ag), copper (Cu), gold (Au), platinum (Pt), or palladium (Pd) ions comprises applying an oxidation solution 22 to the surface of the thin metal film 14B (e.g., submersing the substrate 18 with the thin metal film 14B in to the oxidation solution 22). Importantly, the oxidization solution 22 comprises silver (Ag) ions that act as an oxidization catalyst. Additionally important, by comprising the Ag ions the oxidization solution 22 will provide a very thin, very uniform oxidization layer 26B across the entire top surface of the thin metal film 14B. Furthermore, the uniform oxidization layer 26B will comprise a layer of hydroxide ions 30B uniformly distributed across the entire top surface of the uniform oxidization layer 26B.

Subsequently, the step 106 of submersing the cumulative structure in to the growth solution 34 comprises submersing the cumulative structure comprising the substrate 18, the thin metal film 14B, the uniform oxidization layer 26B with the monolayer of hydroxide ions 30B into a growth solution 34 of aqueous 1:1 solutions of zinc nitrate hexahydrate and hexamethylenetetramine and heating the growth solution 34 to a temperature between 5° C. and 150° C. The growth solution 34 can be heated using and desirable heating means such as a hot plate 46 or an oven. Consequently, the Zn+2 ions 38 in the growth solution replace the hydroxide ions 30B to form the uniform layer of evenly distributed zinc ZnO nuclei 38 on the top surface of the uniform oxidization layer 26B. Thereafter, the ZnO nuclei 38 aggregate to form one or more subsequent uniform layers of evenly distributed ZnO nuclei 38, and due to the very uniform layers of evenly distributed ZnO nuclei 38, nanowires 42 will grow in an uniform, evenly distributed vertical orientation.

The low temperature hydrothermal method 100 described herein enables controlled growth on any substrate, thereby enabling a broad expansion of the applications of ZnO materials without restrictions imposed by the shape of the substrate materials. In the analysis below, it is demonstrated that the electronegativity of the Ag catalyst layer, i.e., the Ag ions that act as an oxidization catalyst, influences the controlled production of direction-dependent ZnO nanowires on virtually any substrate in any shape.

It should be noted that all of nutrition solutions, i.e., growth solutions, are maintained for nanowire growth with the pH range of 8-10. Basic solutions (such as ammonium hydroxide) can be added to stabilize pH of nutrition/growth solutions.

Analysis

The following provides description of testing, test results and analysis that further describe and support the low temperature hydrothermal method 100 described above.

Figure 3A:
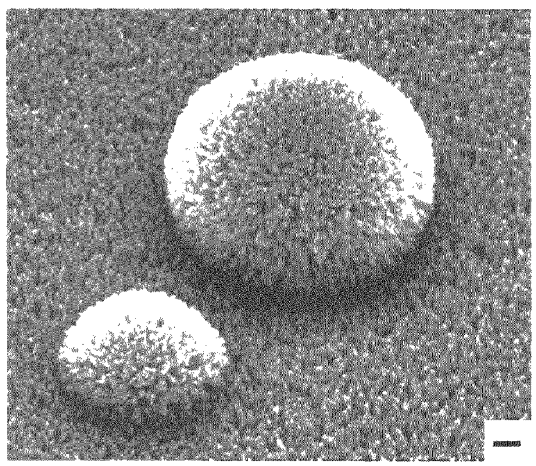
Figure 3B:
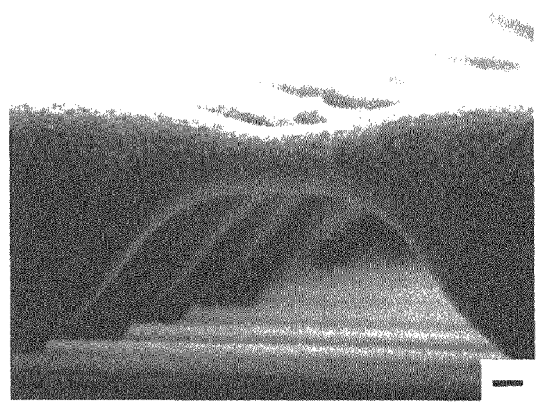
Figure 3E:
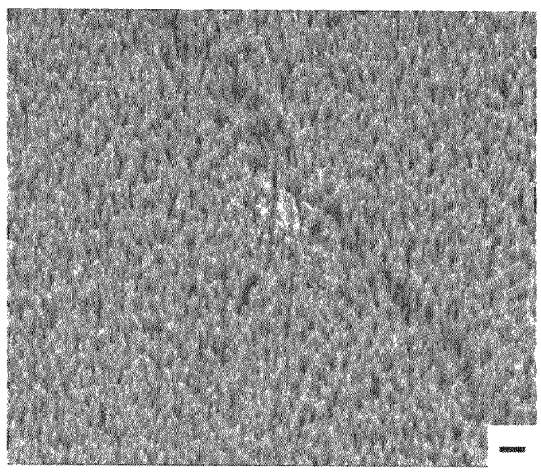
Figure 3F:
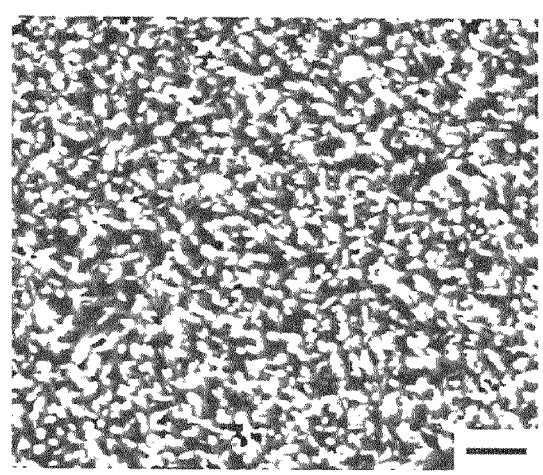

In one exemplary study, the ZnO nanowires were grown vertically on various substrates, including polyimide, SU-8, polyethylene terephthalate (PET), polydimethylsiloxane (PDMS), parylene-C, glass, and silicon. A thin film of silver was deposited by radio-frequency (RF) sputtering or thermal evaporation onto each substrate and was then exposed to ambient air for a day (24 hours) to enable natural oxidation to occur. FIGS. 3a through 3F present scanning electron microscopy (SEM) images of ZnO nanowires grown on oxidized silver films deposited over the various substrates. Some of the illustrated nanowires were initially prepared with highly topological structures, and the nanowires with many hemispherical structures, as illustrated in FIG. 3a were synthesized using microparticles on a PET substrate. The bridge-shaped microstructures shown in FIG. 3b were formed with SU-8 photosensitive resist. The ZnO nanowires were subsequently grown over the morphological surfaces coated with the oxidized silver film. Selective nanowire growth within a photolithographically predefined area was also demonstrated. Zinc oxide nanowires failed to grow on bare silicon and glass substrates, with nanowire growth restricted to the patterned oxidized silver film, as illustrated in FIG. 3c. The structure of an individual ZnO nanowire synthesized on oxidized silver was studied using localized nucleation sites hindering lateral growth on a polyethyleneimine (PEI) substrate. PEI can strongly adsorb onto the negatively charged ZnO surface due to electrostatic interactions with protonated amino groups (—NH$_2$) on the PEI chain. Thus, neutralized side facets of ZnO cannot collect ions supplied from the nutrition solution. FIG. 3d shows an individual nanowire grown vertically with respect to the surface of the oxidized silver film. Although the surface of the oxidized silver is not even, the base of a single ZnO nanowire is clearly observed due to the largely limited lateral growth of the nanowire. FIGS. 3e and 3f show ZnO nanowires grown vertically on oxidized silver-coated PDMS and parylene-C, respectively.

Further experimentation determined the crystallinity of the ZnO nanowires by performing X-ray diffraction (XRD). FIG. 4a shows the XRD patterns of a pure ZnO film deposited on a silicon substrate using an RF sputtering system (black line), ZnO nanowires grown on an oxidized silver film on a polyimide substrate (red line), and ZnO nanoparticles grown in the nutrition solution (blue line). The ZnO film deposited at a high temperature of 300° C. contains a peak at approximately 34.38° that corresponds to the (0002) spacing of the wurtzite structure of ZnO; the occurrence of this peak indicates preferential alignment in the c-axis direction. For the ZnO nanowires on the Ag film, two XRD peaks were observed at approximately 34.36° and 38.04°; these peaks indicate vertically grown ZnO (0002) and Ag (111), respectively. In the hexagonal structure of ZnO, the plane spacing is related to the lattice constants a and c and to the Miller indices by the relation $$\frac{1}{d_{(hkl)}^2} = \frac{4}{3}\left(\frac{h^2+hk+k^2}{a^2}\right) + \frac{l^2}{c^2},$$

with the first-order approximation n=1, $$\sin^2\theta = \frac{\lambda^2}{4a^2}\left[\frac{4}{3}(h^2+k^2+hk)+\left(\frac{a}{c}\right)^2 l^2\right].$$

For the (002) orientation at 2θ=34.38° and 34.36°, the lattice constant c was estimated to be 0.5213 nm and 0.5216 nm, respectively, according to $$c = \frac{\lambda}{\sin\theta}.$$

The c-value of strain-free bulk ZnO is 0.5205 nm, which is smaller than the corresponding values of ZnO/Si and ZnO nanowire/Ag. This result means that the ZnO film and ZnO nanowires have similar tensile stresses. Although ZnO nanowires were grown on a flexible polyimide substrate, the half-maximum full wavelength (i.e., the full-width at half-maximum, FWHM) of the peak in XRD pattern of the ZnO nanowires (0.14°) is slightly narrower than that of the ZnO film (0.15°). The peak positions and FWHMs obtained from the ZnO film and the ZnO nanowires indicate that the lattice mismatch of ZnO nanowires on oxidized silver is similar to that of the ZnO film on silicon. Normally, the lattice constant of diamond-structured silicon is 0.543 nm. The mismatch between silicon (001) and ZnO (002) is estimated to be 104.16%. However, silver (111) with an FCC crystal structure has a lattice constant of 0.4094 nm, as calculated by $$a = \frac{\lambda\sqrt{h^2+k^2+l^2}}{2\sin\theta}.$$

If ZnO nanowires are grown on pure Ag (111), then the lattice mismatch is evaluated as 78.49%. This result means that ZnO (002) on Ag (111) has a compressive stress and must exhibit a lower XRD peak position than pure ZnO (002). Naturally oxidized silver on polyimide shows an XRD peak position of 34.32° related to Ag$_2$O (111). This peak is similar to that of ZnO (002), which indicates a low lattice mismatch between Ag$_2$O and ZnO. Unlike these two cases, ZnO nanoparticles exhibited broad XRD peaks at 31.69°, 34.36°, and 36.16° because ZnO nanoparticles consist of large polycrystalline grains. Since ZnO nanoparticles were self-synthesised in solution, the growth directions are (100), (002), and (101), as shown in FIG. 4a (blue line). In addition, structural properties of ZnO film, nanowires, and nanoparticles are clearly distinguishable from each other as shown in SEM images of FIG. 4b.

Figure 5A:
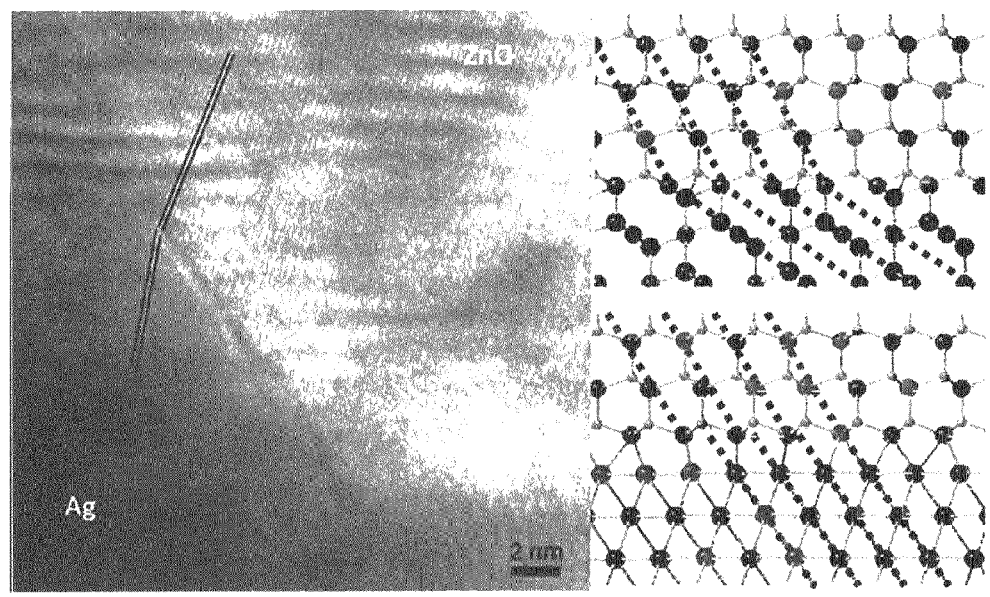
FIG. 5a illustrates a high-magnification TEM image of an interfacial region of a ZnO nanowire and oxidized silver, in accordance with various embodiments of the present disclosure.
Figure 5B:
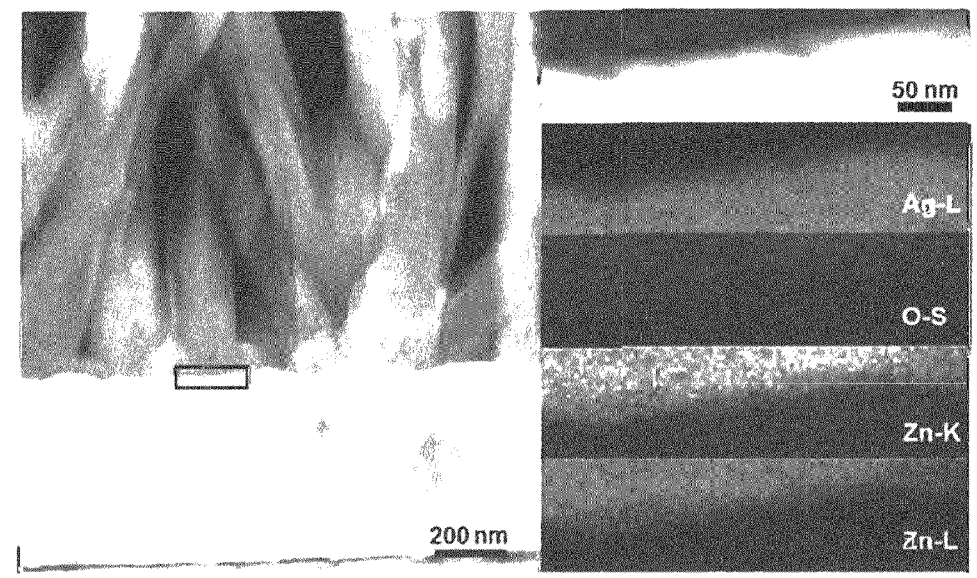
FIG. 5b is a structural model showing the interface between ZnO and Ag (or $Ag_2O$) as a function of the crystallographic direction, in accordance with various embodiments of the present disclosure.

In addition, a conventional transmission electron microscope was used to further examine the structure of ZnO nanowires grown on naturally oxidized silver on a Cu grid. The ZnO nanowires were grown for 3 hours in a 40 mM solution at pH 9 with 4 g of PEI. A high-magnification TEM image of the interfacial region of a ZnO nanowire and oxidized silver is shown in FIG. 5a. The atomic lines at the ZnO/Ag interface region are curved with a certain angle. FIG. 5b is a structural model showing the interface between ZnO and Ag (or Ag$_2$O) as a function of the crystallographic direction. The Ag has a faced centred space group of Fm-3m and a=0.40853 nm, whereas Ag$_2$O has cuprite cubic structure with a space group of P-3m1 and a=0.4736 nm. The ZnO has a hexagonal space group of P63mc with a=0.3250 nm and c=0.5207 nm. As shown in FIG. 5b, the interface bound by ZnO (0002) and Ag$_2$O (111) clearly shows the regularity of the Ag—O—Zn bonds due to their similar lattice parameters. The curved atomic lines are in good agreement with the TEM analysis. However, the interface directly contacted by ZnO (0002) and Ag (111) does not show any regularity in Ag—O—Zn bonds due to the large difference in lattice parameters between these two materials. This irregular interface may result in interfacial stress and defect formation. The lattice mismatch at the nanowire-substrate interface has a dominant effect on the tendency of nanowires towards either vertical or random epitaxial growth on heterogeneous structures. High structural strain due to a high degree of lattice mismatch makes the nucleation and growth of a nanowire on a substrate impossible. Most nanowires that have been successfully grown on substrates have lattice mismatches of less than 12%. Nanowires with larger lattice mismatches with the substrate tend not to grow in the vertical <111> direction, whereas materials with minimal lattice mismatches can readily grow in the vertical <111> direction. A change in the growth direction between vertical and non-vertical <111> directions may serve as a means to relieve strain at the nanowire-substrate interface and may explain the large yield of non-vertical nanowires in material systems with large lattice mismatches. Therefore, it is believed that the lattice constant of oxidized silver is matched as an interlayer between ZnO and pure Ag. This result is in good agreement with XRD data, which indicates that the oxidized silver layer is too thin and that the peaks of oxidized silver and ZnO could overlap.

An additional analysis was conducted using scanning TEM (STEM) and X-ray energy-dispersive spectroscopy (XEDS) mapping (highlighted box) at the interfacial region between ZnO and oxidized silver. An additional analysis was conducted using STEM and XEDS appear at the localized ZnO and Ag portions of the interface. Interestingly, the spatial distribution of the O—S shell is not atomically abrupt and is found deep inside the Ag layer, indicating the formation of silver oxide.

To accurately determine whether an oxidized interlayer exists between the Ag film and the ZnO nanowire, an X-ray photoelectron spectroscopy (XPS) was used to characterize the composition of a pure ZnO film deposited on silicon, ZnO nanowires grown on an oxidized silver film, and ZnO nanoparticles grown in solution. FIG. 6a presents the XPS spectra of the pure ZnO film, the ZnO nanowires, and the ZnO nanoparticles, which indicate the presence of Zn, O, Ag, Ti, N, and C. Titanium results from the thin Ti layer present as an underlayer of Ag. As shown in FIG. 6b, the binding energy (BE) scale was calibrated using the carbon peak (C-1s) at 285 eV as a reference. As these samples were exposed to ambient air prior to the XPS analysis, small amounts of carbonyl compounds (CO and $CO_2$) were observed, resulting in two additional peaks at 286.6 and 288.7 eV, respectively. Those peaks arising from carbonyl compounds were also used as a reference to identify the different O-related species present in the samples. The pure ZnO film exhibited a Zn-$2p_{3/2}$ core level with a peak position of 1020.58 eV, as shown in FIG. 6c. However, the Zn-2p levels of the ZnO nanowires were shifted to higher binding energies towards 1021.46 eV, whereas those of the ZnO nanoparticles were 1021.28 eV. BE shifts of +0.88 eV for the ZnO nanowires and +0.70 eV for the ZnO nanoparticles were measured with respect to the Zn-2p BE of the pure ZnO film. The shifts of the Zn-2p peaks toward high energy suggests the presence of additional chemical states of Zn, indicating a decrease in the number of Zn atoms bound to oxygen due to the deposition of ZnO in an oxygen-rich environment. In addition, a similar phenomenon was observed for the formation of Ag—O—Zn bonds.

FIG. 6d presents the asymmetric peaks observed in the O-1s region deconvoluted by several subspectral components: (i) ZnO, (ii) defective ZnO, or ZnOH, (iii) $Ag_2O$ or Ag—O—Zn, or adsorbed oxygen species, (iv) CO (531.1 eV), and (v) $CO_2$ (532.5 eV). In addition to the CO and $CO_2$ signals, the pure ZnO film exhibits two additional peaks at 529.55 eV and 531.96 eV, which were assigned to O ions in stoichiometric Zn—O—Zn and to an oxygen-deficient $ZnO_x$ region, respectively. To determine the stoichiometry of $ZnO_x$ $(OH)_y$, the O-1s/Zn-2p ratio of the ZnO film was estimated to be 1.25, whereas those of the ZnO nanowires and ZnO nanoparticles were calculated to be 1.27 and 1.48, respectively. In addition to peaks related to stoichiometric ZnO, defective ZnO or ZnOH, CO, and $CO_2$, an additional small feature at 533.2 eV was observed in the spectra of ZnO nanowires and nanoparticles. This feature could be assigned to Ag—O bonds or to bonds related to adsorbed oxygen species (i.e., $H_2O$ or adsorbed $O_2$). As discussed for the XRD analysis, however, no evidence of a significant increase in the lattice parameter c was found when $Zn^{2+}$ ions were replaced by $Ag^+$ ions because of the larger radius of $Ag^+$ ions (0.126 nm) compared with $Zn^{2+}$ ions (0.074 nm).

The Ag-3d BE region (shown in FIG. 6e) consists of an asymmetric peak that could be fitted with a doublet tentatively assigned to the Ag-$3d_{5/2}$ core levels of two different species: $Ag_2O$ (367.32 eV, 75.04% of the total Ag XPS signal) and Ag (368.35 eV, 24.96%). Theoretically, the deposited silver is spontaneously oxidized by atmospheric oxygen at room temperature in the chemical reaction $4Ag(s)+O_2 \rightarrow 2Ag_2O(s)$. The standard-state enthalpy $(\Delta H°_{rxn})$ and entropy $(\Delta S°_{rxn})$ changes for this reaction are −62.2 kJ and −0.133 kJ/K, respectively, as calculated from the thermodynamic data. These values indicate that the reaction is exothermic and that the entropy of the reaction is negative. The standard Gibbs free energy $(\Delta G°_{rxn})$ of the reaction can be calculated as $\Delta G_{rxn}° = \Delta H_{rxn}° - T[\Delta S_{rxn}° + R\ln(P)]$, where R and P are the ideal gas constant and the gas pressure, respectively. At 298 K and 1 atm, the Gibbs free energy is estimated to be −22.6 kJ. Therefore, the $Ag_2O$ present on silver exposed to the natural oxygen environment is naturally formed.

The dependence of the average nanowire height on growth time is illustrated in FIG. 7a. The solution was fixed to a concentration of 20 mM. Two distinct growth kinetics can be observed: a rapid step, which takes less than 2 hours, with a growth rate of 5.27 nm/min; and a fluctuation in the kinetics of nanowire growth due to lower super-saturation of precursors. To understand the growth mechanism, the pH value and solution temperature were measured as a function of growth time. The initial pH value was set to 9, and the hot-plate temperature was fixed at 90° C. The difference between the set temperature and the solution temperature resulted from the poor thermal conductivity of the glass and the aqueous solution, as shown in FIG. 7b. In the initial stage, the pH value decreased due to the protonation of the solution by heating. The relationship between pH and the fluctuating growth pattern of ZnO nanowires observed in FIG. 7a can be interpreted as indicating that the ZnO nanowires stop growing at a pH value of approximately 8.4. When the pH value falls below 8.4, the length of the ZnO nanowires decreases due to the dissolution of the nanowires back into the solution.

To understand the reaction kinetics in detail, a speciation diagram of intermediate metal hydroxide and amine complexes from known constants was calculated. FIGS. 8a and 8b show the ion complex distribution of $Zn^{2+}$ and $Ag^+$ ions using the time, solution temperature, and pH values determined from the calculated speciation diagrams. Silver(I) ions are normally generated from $Ag_2O$ in aqueous solution because pure silver cannot be ionized in aqueous solution. In the initial stage, $Zn^{2+}$ ions are mostly converted into Zn(OH)$^+$ and Zn(OH)$_2$, whereas Ag$^+$ ions are dominant in solution. The presence of Ag$^+$ ions on the surface can attract negative ions such as OH$^-$, Zn(OH)$_3^-$, and Zn(OH)$_4^{2-}$ through Coulombic attraction rather than positive or neutral ions such as NH$_3^+$, Zn$^+$, Zn(OH)$^+$, and Zn(OH)$_2$. However, because the amine complexes are strongly adsorbed due to their high solubility at high pH, the Ag$^+$ can rapidly form more [Ag(NH$_3$)$_2$]$^+$ than AgOH in the initial growth stage, as shown in FIG. 8b. To understand the effect of protonation in solution, the pH values of a 20 mM zinc nitrate hexahydrate and hexamethylenetetramine (HMT) solution were measured with an oxidized silver film on a polyimide substrate. For reference, pH values were also measured in the same reaction solution without an oxidized silver film. All solutions were measured at room temperature and were fixed at an initial pH value of 9 with additional ammonium hydroxide. The pH values of all solutions rapidly decreased in the initial stage due to the increase in protons. For the growth of ZnO in an aqueous mixture of zinc nitrate hexahydrate, hexamethyleneimine, and ammonium hydroxide, the possible reactions are $2H_2O+Zn^{2+} \Leftrightarrow Zn(OH)_2+2H^+ \Leftrightarrow ZnO+2H^++H_2O$ and $[Zn(NH_3)_4]^{2+}+3H_2O \Rightarrow ZnO+2NH_4^+ 2NH_3 \cdot H_2O$. However, the second reaction produces ammonium hydroxide, which can subsequently react with water to produce hydroxide ions via the reaction $NH_3+H_2O \Rightarrow NH_4^++OH^-$. This reaction means that the pH of the mixture would increase with reaction time. Therefore, the main ZnO reaction that occurs in the initial stage of this experiment is the first reaction because the pH value of the solution with an oxidized silver film decreases with reaction time, as shown in FIG. 8b. Because this reaction can produce ammonia to increase the pH value via the equation $2[Ag(NH_3)_2]^++2OH^- \Rightarrow Ag_2O+4NH_3+H_2O$, this reaction is also inconsistent with the rapid decrease in pH observed in the initial reaction stage. Notably, many metal oxides would hydrolyse in the presence of water to form hydroxide layers at the surface (≡M-OH). An oxide or hydroxide surface (≡M-OH) can become charged by reacting with H$^+$ or OH$^-$ ions due to surface amphoteric reactions. Therefore, Ag$^+$ ions on the Ag$_2$O surface can form Ag—OH. Interestingly, Ag$^+$ and Zn$^{2+}$ ions are known as B-type metal cations with low electronegativities, i.e., in the case of Ag—OH, the bond length of Ag—O is shorter than that of O—H because Ag ($\chi^{Ag}$=1.93) is less electronegative than H ($\chi^H$=2.20). In water, OH$^-$ can convert Ag—OH into Ag—O$^-$+H$_2$O. At the same time, Zn$^{2+}$ ions with a low electronegativity ($\chi^{Zn}$=1.65) near Ag—O$^-$ can be easily bonded to form Ag—O—Zn$^+$. After Zn$^+$ ions are chemisorbed onto the Ag$_2$O surface, Zn$^+$ ions bond oxygen ions to form ZnO. Then, ZnO can fully cover the Ag$_2$O surface in aqueous Zn(NO$_3$)$_2$-HMT-ammonia solution and ZnO nanowires can grow further through hydrothermal synthesis, as determined by further SEM analysis.

Referring to FIGS. 9a-9f, to understand the effect of silver catalyst on other metals, a titanium film was selected, which has a low electronegativity ($\chi^{Ti}$=1.54), and a molybdenum film, which has a high electronegativity ($\chi^{Mo}$=2.16), and deposited both by RF sputtering onto polyimide films. On the titanium substrate, ZnO nanowires partially grew without any help from the Ag catalyst, and the ZnO nanowires grown on Ti substrates became more dense and c-oriented when the Ag catalyst was used. Although the surface of Ti can be easily oxidized due to its low electronegativity, Ag catalyst treatment can effectively oxidize the surface of Ti because Ag is a well-known oxidation agent and can ionize the surface of the Ti substrate, enabling it to bond to hydroxide anions. These results are in good agreement with XRD data for ZnO nanowires with and without Ag catalyst treatment. No Ag-related XRD peaks were observed in the pattern of the Ag catalyst-treated Ti surface. The rutile type crystal structure of TiO$_2$ is well known to have a tetragonal structure with space group P4$_2$/mnm and a=0.4594 nm.

Interestingly, the tetragonal structure can be combined with a hexagonal structure. In addition, because the Ti substrate has the same lattice as TiO$_2$, the lattice constant c of ZnO becomes close to that of bulk ZnO when ZnO nanowires are grown on a Ag-treated Ti substrate, as shown in FIG. 9c. For molybdenum, however, ZnO nanowires were not grown because the electronegativity of Mo is larger than those of the other materials and because the surface of Mo easily loses adsorbed oxygen ions to the solution. To overcome this problem, both oxygen-plasma and Ag-catalyst treatments were employed to oxidize a Mo metal surface. As shown in the SEM image in FIG. 9e, randomly grown ZnO nanowires fully covered the oxidized Mo surface. Unlike the case of Ti substrates, the Ag peak in the XRD pattern of the Mo substrate indicates that self-synthesized Ag particles may adhere to the rough surface of ZnO nanowires grown on the Mo substrate. This phenomenon was also observed on the Cu substrate. The ZnO nanowires were randomly grown due to the crystal structure of Mo, which has a body-centred cubic structure with a space group of Im-3m and a=0.3147 nm. Although MoO$_2$ has a tetragonal structure with a space group of P4$_2$/mnm and a=0.487 nm, the Mo substrate can compress the thin MoO$_2$ interlayer formed by plasma and Ag-catalyst treatments due to the large lattice mismatch between Mo and MoO$_2$. This stressed MoO$_2$ interlayer can affect the growth direction of ZnO nanowires. This stress was observed in the XRD data (FIG. 9f), where the ZnO (002) peak shifted from 34.42° to 34.60°, thereby indicating an increased ZnO lattice constant.

The unique properties of oxidized silver lead to highly controlled growth of ZnO nanowires on various substrates. The oxidized silver films provide a surprisingly good lattice-matched structure with ZnO. Ionized Ag strongly attracts negatively charged Zn ion complexes by Coulombic forces to nucleate ZnO on a silver oxide film. Other metal substrates have been used as heterogeneous growth substrates for ZnO nanowires with the help of plasma and Ag-catalyst treatments. The low-temperature method 100 described herein has the potential to support numerous important applications by enabling the well-controlled synthesis of ZnO nanowires on any substrate.

Referring to FIGS. 10a-10d, in another exemplary study, the generation of piezoelectric power from ZnO nanowires grown on naturally oxidized silver coated on a flexible poly(dimethylsiloxane) (PDMS) substrate using the low-temperature hydrothermal growth method 100 was demonstrated. In this study, a PDMS substrate was prepared using Sylgard 184A and B (Dow Corning) mixed at a 10:1 mass ratio. The PDMS substrate was then cured at 85° C. for 25 hours. FIG. S1a shows an SEM image of ZnO nanowires grown on oxidized silver nanoparticles on a flexible PDMS substrate. The Ag nanoparticles were synthesized using the chemical reduction of silver nitrate in ethanol solution and were then oxidized in ambient air. Because the surface of the Ag nanoparticle layer was very rough, the nanowires grew in random directions. Due to the flexibility of the PDMS substrate, the sample easily bends, as shown in FIG. 10b. The flexibility of ZnO nanowire-coated PDMS contributes to the generation of piezoelectric energy, as demonstrated in FIG. S1d. As shown in FIG. S1c, PMMA was spin-coated to insulate two electrodes on both sides of the ZnO nanowires. To complete the device, a 1.5×4 cm$^2$ Ag layer was deposited onto the open top of the ZnO nanowires by RF sputtering. The two electrodes were coupled with a HP 34401A multimeter and a data acquisition system with a Labview-based interface. FIG. 10d demonstrates that the increase in the output voltage is correlated with the bending. When the sample was bent, the maximum voltage was 100 µV. When the sample was released, the maximum voltage was between −200 and approximately −400 µV. These piezoelectric voltages are attributed to the internal stress, which suggests that the vibration of this material can lead to nanowire expansion and compression.

FIG. 11 presents XRD data of a naturally oxidized silver film on a polyimide substrate. The peak position at 34.32° is related to $Ag_2O$ (111), corresponding to the XRD peak position of ZnO (002).

To compare ZnO nanowires grown on different seed layers, more SEM images of ZnO nanowires on a thin ZnO film and a thin Ag film were taken, as shown in FIGS. 12a and 12b. Although ZnO nanowires were heterogeneously grown on oxidized Ag layers, the ZnO nanowires are similar in structural properties of ZnO nanowires grown on a perfectly lattice-matched ZnO seed layer. These results illustrate that ZnO nanowires can grow vertically on an oxidized Ag layer.

Due to the increased concentrations of the nutrition solutions with pH values greater than 8.4 (FIG. 13a) and the increased amount of $Zn^+$ ions, these ZnO nanowires grew much longer than those synthesised in the 20 mM nutrition solution, as shown in FIG. 13b. However, the ZnO nanowires continuously grew to ~2.500 µm in the 40 mM nutrition solution, whereas, in nutrition solutions with concentration greater than 40 mM, the ZnO nanowires were dissolute in solution. As the solution temperature was increased to 90° C., the height of the ZnO nanowires increased (FIG. 13c). The height of the ZnO nanowires reached a plateau at solution temperatures greater than 90° C. because the increased $Zn^+$ ions due to the enhanced ion dissociate rate at high temperature contributed to the growth of lateral planes of the ZnO nanowires.

FIG. 14 illustrates pH values of a solution with oxidized silver films on polyimide and a reference solution at room temperature, in accordance with various embodiments of the present disclosure.

FIG. 15a shows an SEM image of the ZnO nanostructures after 10 min in a 20 mM solution. These ZnO nanostructures grew like islands and the growth depends on the growth rates of different growth planes in the ZnO crystals and on the short mean free paths of ions due to the low solution temperature; this dependence is due to the growth occurring according to the Volmer-Weber mechanism (i.e., island growth mode) rather than the Frank-Merwe mode (layer-by-layer growth mode) to reduce the strain during growth. At 15 min, ZnO nanostructures partially covered the silver surface, as shown in FIG. 15b. FIG. 15c shows the ZnO nanowires fully grown on the silver substrate after 30 min.

Basically, the ZnO nucleation occurs at stable sites with lowest surface energy. The sites with large lattice mismatch between ZnO and metal substrate are forced to separate ZnO nucleus due to their high surface energy. To reduce surface energy and lattice mismatch, water molecules can oxidize the ionized metal layer using environmental thermal energy given by $M^+ + OH^- \rightarrow M(OH) \rightarrow MO^- + H^+$, where M is metal. Usually, ionized metal atoms result from oxidized metal atoms, which have been exposed and oxidized in ambient air. These oxidation processes on metal surfaces typically happen non-uniformly. In addition, the lattice constant of a metal oxide layer seriously affects the growth of ZnO nanostructures on itself. Therefore, when both requirements are met, ZnO nanowires can be successfully grown on the metal oxide layer.

Referring to FIGS. 16a and 16b, a silver nitrate was applied to a copper film deposited by RF sputtering on a polyimide substrate. Normally, ZnO nanowires do not grow on Cu substrates because $Cu(OH)_2$ is soluble in the ammonia solution used to increase the pH. However, when 1 mM silver nitrate was added to the nutrition solution, ZnO nanowires were successfully grown, as shown in FIGS. 16a and 16b. During the growth of the ZnO nanowires, Ag particles self-synthesised and stacked on the ZnO nanowires. These particles were confirmed to be Ag particles by EDS analysis.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A method of producing nanowires on arbitrary substrate, said method comprising:
    depositing a thin non-zinc metal seed layer as a heterogeneous seed layer on a substrate, the non-zinc metal comprising at least one of silver (Ag), wherein the substrate is at least one of curved and flexible;
    oxidizing the non-zinc metal seed layer to produce an oxidation layer on the non-zinc metal seed layer and to reduce lattice mismatch between the non-zinc metal seed layer and nanowire to be grown on the oxidation layer, wherein the oxidation layer comprises a uniform layer of one of Ag2O ions or hydroxide ions, and oxidizing the non-zinc metal seed layer comprises allowing the non-zinc metal seed layer to naturally oxidize in ambient air for a selected amount of time to provide the oxidation layer comprising a uniform layer of the one of Ag2O or hydroxide ions; and
    submersing the substrate with the oxidized non-zinc metal seed layer into a growth solution at a temperature of 5° C. to 150° C., the growth solution comprising Zn+2 ions whereby the Zn+2 ions replace the one of Ag2O ions or hydroxide ions to form one or more uniform layers of ZnO nuclei from which nanowire will grow.

2. The method of claim 1, wherein oxidizing the non-zinc metal seed layer comprises providing an ionized surface which attracts the Zn+2 ions.

3. The method of claim 1, wherein oxidizing the non-zinc metal seed layer comprises providing a lattice matched non-zinc heterogeneous seed layer.

4. The method of claim 1, wherein oxidizing the non-zinc metal seed layer comprises providing low temperature growth condition by Coulombic attraction between the Zn+2 ions and the one of Ag2O ions or hydroxide ions.

5. The method of claim 1, wherein the substrate comprises at least one of a metal, a plastic, a rubber, a synthetic and a composite material.

6. The method of claim 1, wherein the substrate comprises at least one of a hemisphere, a bridge, a wire, and a flat surface.

7. The method of claim 1, wherein depositing the non-zinc metal seed layer comprises depositing a thin layer of at least one of silver (Ag), nickel (Ni), iron (Fe), aluminum (Al), titanium (Ti), molybdenum (Mo), tungsten (W), and copper (Cu) on the substrate.

8. The method of claim 1, wherein oxidizing the non-zinc metal seed layer comprises applying and oxidizing agent to the non-zinc metal seed layer, wherein the oxidizing agent comprises at least one of silver (Ag), copper (Cu), gold (Au), platinum (Pt), palladium (Pd) ions and related alloys.

9. The method of claim 1, wherein depositing the non-zinc metal seed layer comprises using at least one of radio frequency (RF) sputtering, chemical vapour deposition (CVD), electroless deposition, and electrochemical deposition (ED).

* * * * *